United States Patent [19]

DePuydt et al.

[11] Patent Number: 5,274,269
[45] Date of Patent: Dec. 28, 1993

[54] OHMIC CONTACT FOR P-TYPE GROUP II-IV COMPOUND SEMICONDUCTORS

[75] Inventors: James M. DePuydt, St. Paul; Jun Qiu, Woodbury; Hwa Cheng, Woodbury; Michael A. Haase, Woodbury, all of Minn.

[73] Assignee: Minnesota Mining and Manufacturing Company, St. Paul, Minn.

[21] Appl. No.: 700,606

[22] Filed: May 15, 1991

[51] Int. Cl.$^5$ ............... H01L 23/48; H01L 29/40
[52] U.S. Cl. ................... 257/744; 257/37; 257/99; 257/743
[58] Field of Search ............. 357/65, 61, 17; 257/37, 257/99, 442, 742, 743, 744

[56] References Cited

U.S. PATENT DOCUMENTS

| | | | |
|---|---|---|---|
| 4,607,369 | 8/1986 | Niina et al. | 357/17 |
| 4,735,662 | 4/1988 | Szabo et al. | 357/30 |
| 4,868,615 | 9/1989 | Kamata | 357/17 |
| 4,959,106 | 9/1990 | Nakagawa et al. | 357/16 |
| 5,008,891 | 4/1991 | Morita | 357/17 |
| 5,037,709 | 8/1991 | Tomomura et al. | 357/17 |
| 5,081,632 | 1/1992 | Migita et al. | 357/17 |

OTHER PUBLICATIONS

"Molecular Beam Epitaxy of CdSe and the Derivative Alloys $Zn_{1-x}Cd_xSe$ and $Cd_{1-x}Mn_xSe$", Samarth et al., J. Electronic Materials, vol. 19, p. 543 (1990).
"Optimum Composition in MBE-$ZnS_xSe_{1-x}$/GaAs for High Quality Heteroepitaxial Growth", Matsumura et al., J. Crystal Growth, vol. 99, p. 446 (1990).
"Molecular-Beam Epitaxy Growth of ZnSe Using a Cracked Selenium Source", Cheng et al., J. Vac. Sc. Tech., vol. B8, p. 181 (1990).
"Growth of P- and N-Type ZnSe by Molecular Beam Epitaxy", Cheng et al., J. Crystal Growth, vol. 95, p. 512 (1989).
"Low-Temperature Growth of ZnSe by Molecular Beam Epitaxy Using Cracked Selenium", Cheng et al., Appl. Phys. Lett., vol. 56, p. 848 (1990).
"Defects in Epitaxial Multilayers", Matthews et al., J. Crystal Growth, vol. 27, p. 118 (1974).
"Metalorganic Vapor Phase Epitaxy of Low-Resistivity P-Type ZnSe", Yasuda et al., Appl. Phys. Lett., vol. 52, p. 57 (1988).
"P-Type ZnSe by Nitrogen Atom Beam Doping During Molecular Beam Epitaxial Growth", Park et al., Appl. Phys. Lett., vol. 57, p. 2127 (1990).

Primary Examiner—Rolf Hille
Assistant Examiner—David Ostrowski
Attorney, Agent, or Firm—Gary L. Griswold; Walter N. Kirn; Lorraine R. Sherman

[57] ABSTRACT

A ZnSe semiconductor device includes a ZnSe pn junction having p-type and n-type layers, and an ohmic contact to both layers. The ohmic contact to the p-type layer includes a p-type ZnSe crystalline semiconductor contact layer, and a conductive electrode layer characterized by a Fermi energy. The contact layer is doped with nitrogen shallow acceptors, characterized by a shallow acceptor energy, to a net acceptor concentration of at least $5 \times 10^{17}$ cm$^{-3}$. The contact layer also includes sufficient deep energy states between the shallow acceptor energy and the electrode layer Fermi energy to enable cascade tunneling by charge carriers.

32 Claims, 13 Drawing Sheets

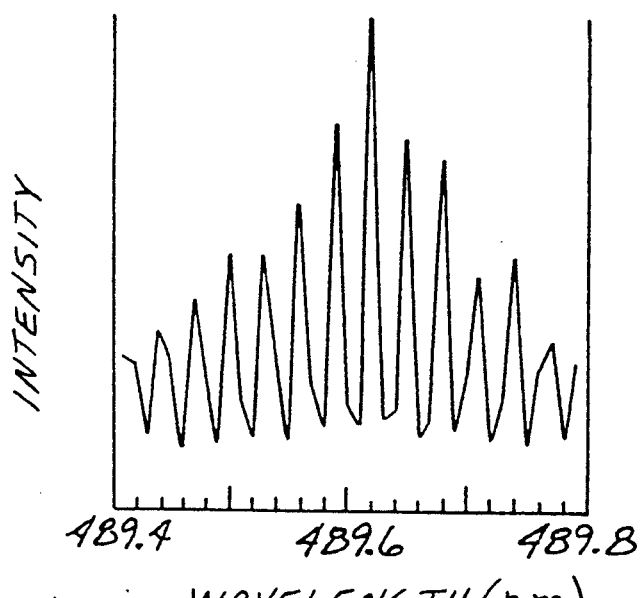
Fig. 6₂

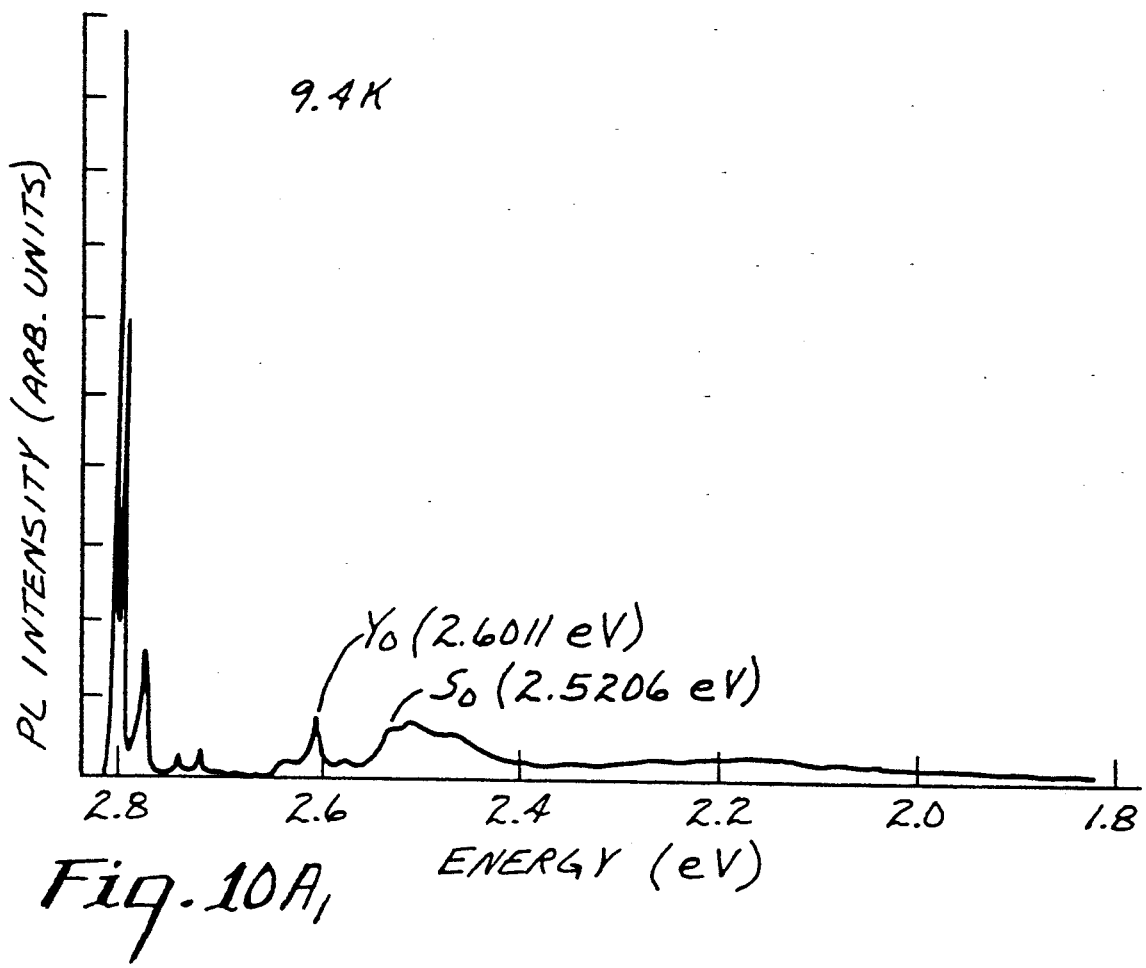
Fig. 10A₁
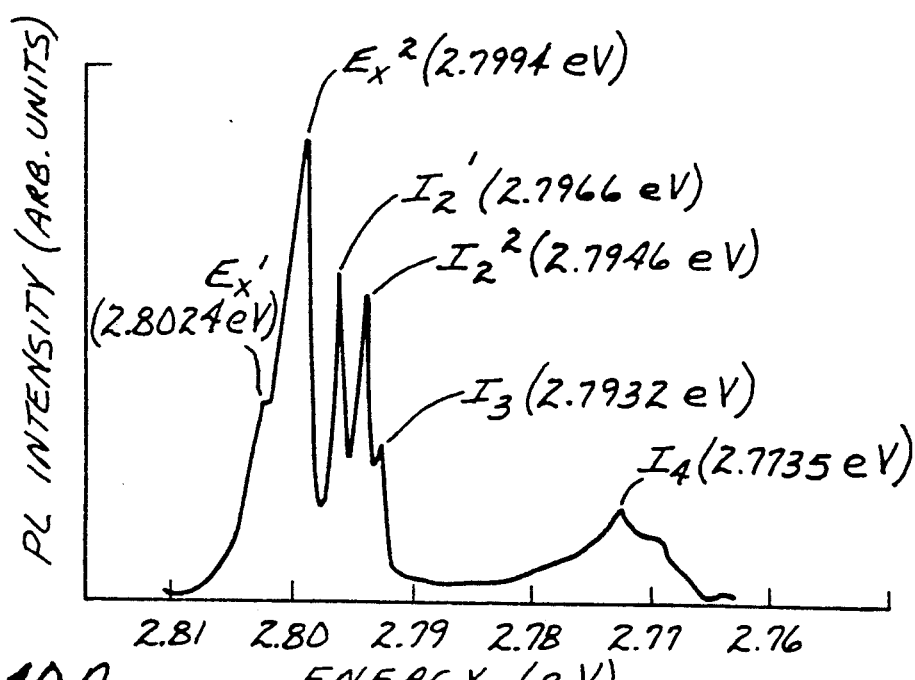
Fig. 10A₂

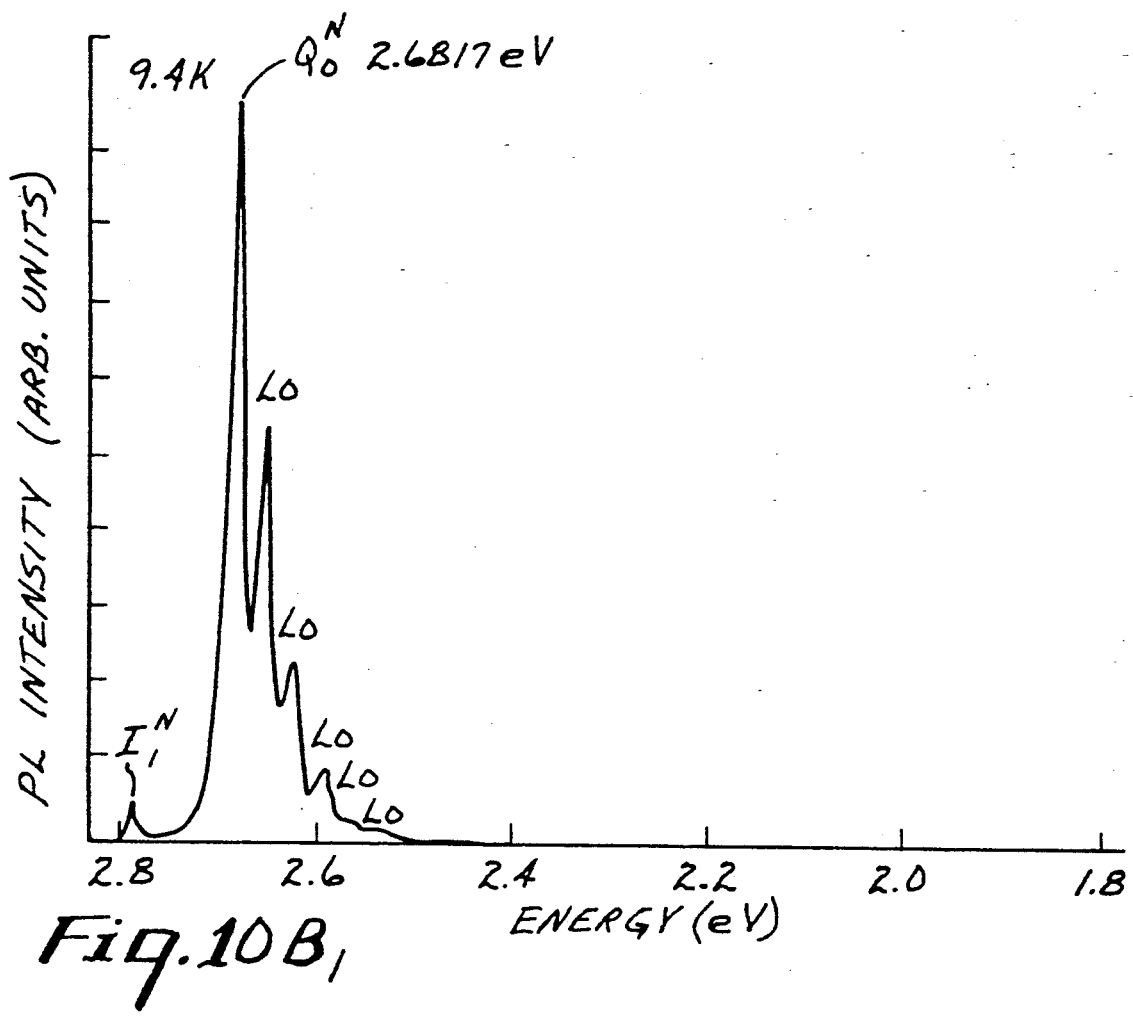
Fig. 10B₁
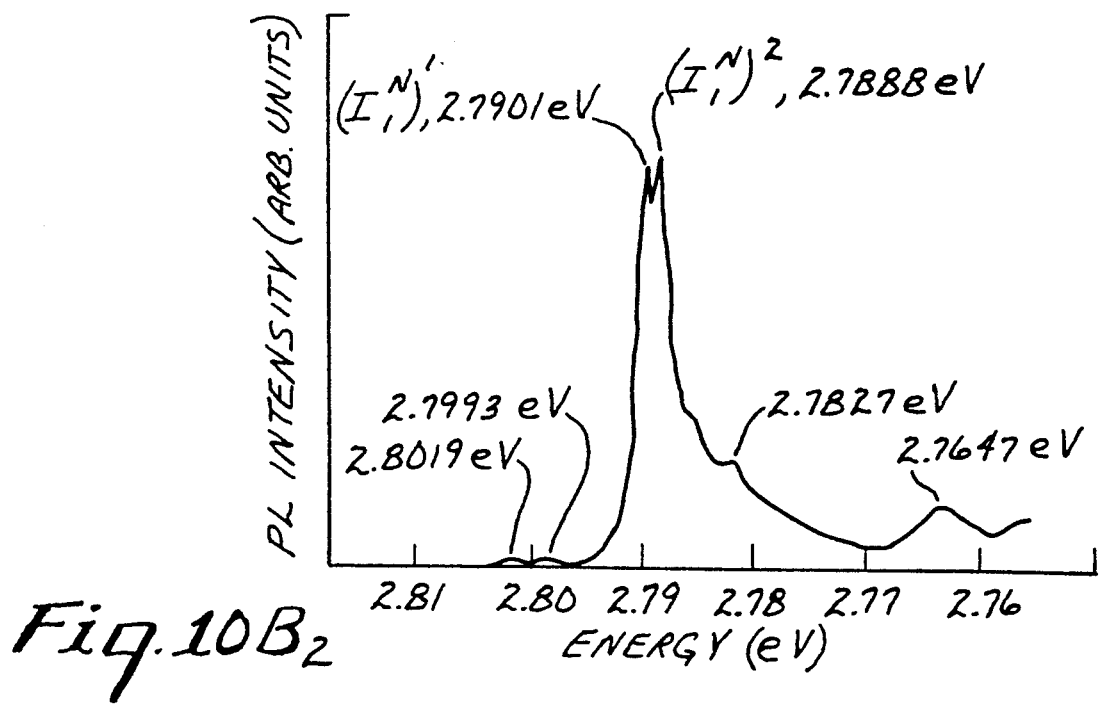
Fig. 10B₂

OHMIC CONTACT FOR P-TYPE GROUP II-IV COMPOUND SEMICONDUCTORS

REFERENCE TO RELATED APPLICATIONS

Reference is hereby made to the following copending and related applications:
1. Park et al. Ser. No. 07/573,428, filed Aug. 24, 1990 and entitled Doping Of IIB-VIA Semiconductors During Molecular Beam Epitaxy.
2. Haase et al. Ser. No. 07/700,580, filed May 15, 1991 and entitled Blue-Green Laser Diode.
3. Qiu et al. Ser. No. 07/700,601, filed May 15, 1991 and entitled Method For Making An Ohmic Contact For P-Type Group II-VI Compound Semiconductors.

BACKGROUND OF THE INVENTION

The present invention relates generally to ohmic contacts for semiconductor devices. In particular, the present invention is an ohmic contact for p-type Group II-VI compound semiconductors.

For many years, wide band gap Group II-VI compound semiconductors, particularly ZnSe, have been identified as promising materials for the fabrication of light emitting devices such as laser diodes which operate in the green and blue portions of the optical spectrum. Because of the wide range of important applications for these devices, considerable amounts of research and development have been devoted to these materials. Many major obstacles to the production of commercially viable II-VI devices have been identified as a result of this work. In fact, despite all this research, rudimentary blue light emitting diodes (LEDs) fabricated from an epitaxial II-VI semiconductor (ZnSe) were only first reported in 1988. See e.g., Yasuda et al., *Appl. Phys. Lett.* 52, 57 (1988). There are no known reports of laser diodes fabricated from these materials.

A significant problem was the inability to p-type dope ZnSe or other appropriate II-VI semiconductor materials to sufficient net acceptor concentrations. Improvements have recently been made in this area. See e.g., the Park et al. U.S. patent application Ser. No. 07/573,428 referred to above and Park et al., *P-Type ZnSe By Nitrogen Atom Beam Doping During Molecular Beam Epitaxial Growth*, Appl. Phys. Lett. vol. 57, p. 2127 (1990).

Another recent advance in II-VI technology involves growing epitaxial films at low temperatures using molecular beam epitaxy and a thermal-cracking source for the Group VI element. See e.g., Cheng et al., *Low Temperature Growth Of ZnSe By Molecular Beam Epitaxy Using Cracked Selenium*, Appl. Phys. Lett., vol. 56, p 848 (1990).

The ability to make low resistance ohmic contacts to both the p- and n-type II-VI semiconductor also presented problems. Good ohmic contacts are necessary for commercially viable (e.g., low operating voltage and low heat generation) II-VI devices.

Conventional techniques for fabricating ohmic metal-semiconductor contacts utilize a metal system (often thermally alloyed) to produce a small barrier to carrier injection, and/or to dope the semiconductor contact layer with shallow (energy level) impurities as heavily as possible at the surface of the layer. Due to the small barrier height and the high doping level in the semiconductor layer, the potential barriers are so thin that tunneling of carriers through the barriers becomes very significant. Most all commercially viable semiconductor devices and integrated circuits employ this approach for current injection.

It was commonly assumed that this technique (e.g., doping and Au evaporation) would also be suitable for producing ohmic contacts to p-type ZnSe and other II-VI semiconductors. In fact, now that low resistance p-type ZnSe can be reproducibly grown, it has been determined that conventional techniques cannot be relied upon to produce acceptable ohmic contacts. The stable low-barrier metal system and very high doping levels are, as of yet, not available for these semiconductors. One exception to these problems is ZnTe, which can be easily doped p-type. It is also possible to make ohmic contacts for this semiconductor using convention techniques. Nonetheless, it is evident that there is a need for improved ohmic contact technology for other p-type II-VI wide band gap semiconductors.

SUMMARY OF THE INVENTION

The present invention is an improved p-type ohmic contact for Group II-IV semiconductors. The contact includes a p-type Group II-VI semiconductor device layer and a p-type Group II-VI crystalline semiconductor contact layer on the first side of the device layer. A conductive electrode layer characterized by a Fermi energy is on the contact layer. The contact layer is doped, with shallow acceptors having a shallow acceptor energy, to a net acceptor concentration of at least $1 \times 10^{-17}$ cm$^{-3}$, and includes sufficient deep energy states between the shallow acceptor energy and the electrode layer Fermi energy to enable cascade tunneling by charge carriers.

In a preferred embodiment the semiconductor device layer includes a ZnSe semiconductor layer. The electrode layer includes a gold layer. The contact layer is doped with nitrogen to a concentration of $1 \times 10^{-19}$ cm$^{-3}$.

BRIEF DESCRIPTION OF THE DRAWINGS

FIGS. 10(a) and 10(b) are graphs of PL intensity versus energy.

DETAILED DESCRIPTION OF THE PREFERRED EMBODIMENTS

Figure 1:
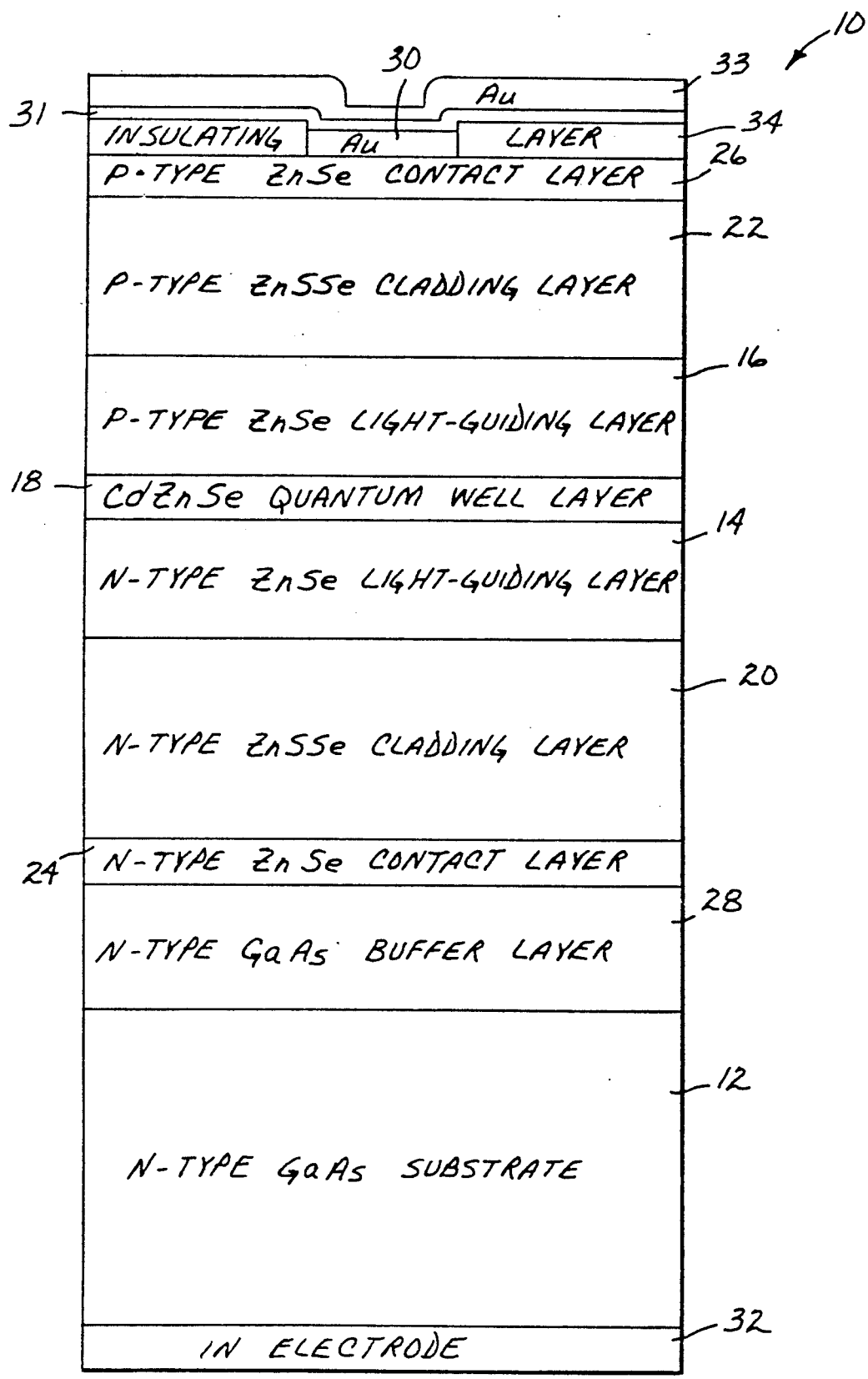
FIG. 1 is a cross sectional view (not to scale) illustrating the structure of a II-VI semiconductor laser diode which includes a p-type ohmic contact layer in accordance with the present invention.

The structure of a laser diode 10 which includes an ohmic contact in accordance with the present invention is illustrated generally in FIG. 1. Laser diode 10 is a wide band gap II-VI device fabricated from heteroepitaxial layers of $ZnS_xSe_{1-x}$, ZnSe, and $Cd_yZn_{1-y}Se$ grown by molecular beam epitaxy (MBE) on a GaAs substrate. Prototypes of this device have exhibited laser action, emitting coherent blue-green light near 490 nm from a $Cd_yZn_{1-y}Se$ quantum well structure under pulsed current injection at 77K.

Laser diode 10 is fabricated on a GaAs substrate 12, and includes lower (first) and upper (second) ZnSe light-guiding layers 14 and 16, respectively, separated by a $Cd_{1-y}Zn_ySe$ quantum well active layer 18. The surfaces of light-guiding layers 14 and 16 opposite active layer 18 are bounded by lower and upper $ZnS_xSe_{1-x}$ cladding layers 20 and 22, respectively. A lower ZnSe ohmic contact layer 24 is positioned on the surface of lower cladding layer 20 opposite light-guiding layer 14, while an upper ZnSe ohmic contact layer 26 is positioned on the surface of upper cladding layer 22 opposite light-guiding layer 16. A GaAs buffer layer 28 separates substrate 12 from lower ZnSe contact layer 24 to assure high crystalline quality of the contact and subsequently deposited layers. A polyimide insulating layer 34 covers the surface of upper ohmic contact layer 26 opposite upper cladding layer 22. Electrical contact to the ohmic contact layer 26 is made by Au electrode 30 which is formed in a window stripe in insulating layer 34. A thin Ti layer 31 and subsequently a final Au layer 33 are applied over polyimide layer 34 and exposed portions of Au electrode 30 to facilitate lead bonding. Electrical contact to the lower side of laser diode 10 is made by an In electrode 32 on the surface of substrate 12 opposite the lower ohmic contact layer 24.

Layers 24, 20 and 14 are all doped n-type with Cl (i.e., are of a first conductivity type) in prototypes of laser diode 10. Layers 16, 22 and 26 are all doped p-type with N (i.e., are of a second conductivity type). Active layer 18 is an undoped quantum well layer of $Cd_{0.2}Zn_{0.8}Se$ semiconductor deposited to a thickness of 0.01 μm. Light-guiding layers 14 and 16 are both 0.5 μm thick. Lower light-guiding layer 14 is doped to a net donor concentration of $1\times10^{17}cm^{-3}$, while upper light-guiding layer 16 is doped to a net acceptor concentration of $2\times10^{17}cm^{-3}$. Cladding layers 20 and 22 are layers of $ZnS_{0.07}Se_{0.93}$ semiconductor deposited to thicknesses of 2.5 μm and 1.5 μm, respectively. The net donor concentration of the lower cladding layer is $1\times10^{18}cm^{-3}$. The net acceptor concentration of the upper cladding layer is $2\times10^{17}cm^{-3}$. Ohmic contact layers 24 and 26 are both deposited to a thickness of 0.1 μm in these prototype devices. The lower contact layer is doped n-type to a net donor concentration of $1\times10^{18}cm^{-3}$. The upper contact layer is doped p-type to a net acceptor concentration of $1\times10^{18}cm^{-3}$.

Other parameters and materials can also be used in the fabrication of laser diodes 10 in accordance with the present invention. For example, the thicknesses of layers 24, 20, 14, 16, 22 and 26 can be varied as needed for given applications. Typical thickness ranges for contact, cladding and light-guiding layers are 0.03 to 1.0 μm, 0.5 to 5.0 μm, and 0.1 to 1.0 μm, respectively. In general, the thicknesses of light-guiding layer 14 and 16 should be chosen to minimize the width of the optical mode. If the layers 14 and 16 are too thin, the evanescent tails will extend far into cladding layers 20 and 22. Cladding layers 20 and 22 must be thick enough to make absorption of the optical mode in substrate 12 and electrode 32 negligible. The composition of the $Cd_xZn_{1-x}Se$ (which determines the laser wavelength) with x of approximately 0.2 was selected to provide a large enough band gap difference ($\Delta E_g$ of approximately 0.2 eV) to facilitate effective carrier confinement. Larger x will provide deeper quantum wells, but would require a thinner layer due to increased lattice mismatch, thereby decreasing the efficiency of the collection of carriers into the well.

The composition of the $ZnS_ySe_{1-y}$ with y of approximately 0.07 was selected to provide sufficient difference in refractive index from the index of the ZnSe guiding layers to form a low-loss waveguide. This composition also provides excellent morphology since it is nearly lattice matched to the GaAs substrate at the growth temperature of 300° C.

Other n-type dopants which may be used include Ga, Al, In, I, F, and Br. Oxygen or Li acceptors can also be used for the p-type dopants. Other Group V p-type dopants which might be used include arsenic and phosphorous. Greater donor and acceptor concentrations can also be used, although they should not be so high as to cause excessive free-carrier absorption.

The prototypes of laser diode 10 are fabricated on Si-doped n+-type GaAs substrate 12 having a (100) crystal orientation. Substrates 12 of this type are commercially available from a number of manufacturers including Sumitomo Electric Industries, Ltd. GaAs buffer layer 28 is deposited to a thickness of 1 μm in this embodiment, and doped n+ with Si to a net donor concentration of $1\times10^{18}cm^{-3}$. Other appropriate substrates (e.g., ZnSe, GaInAs or Ge) and buffer layers such as AlGaAs, AlAs, GaInP, AlInP, AlInAs or GaInAs can also be used. The thickness of buffer layer 28 can also be varied while providing an appropriate high-quality surface for growing the II-VI semiconductors. If an appropriate high-quality substrate and appropriate surface preparation is used, buffer layer 28 may not be needed.

The lattice constants of the ZnSSe cladding layers 20 and 22 and the adjacent ZnSe layers 24, 14 and 16, 26, respectively, are mismatched by about 0.3%. Preliminary transmission electron microscopy (TEM) studies indicate that the ZnSe of light-guiding layers 14 and 16 is at least partially relaxed by dislocations formed at the interfaces of the light-guiding layers and the adjacent ZnSSe cladding layers 20 and 22, respectively. These preliminary studies also indicate that the thickness of the CdZnSe quantum well active layer 18 is less than the critical thickness for this material system. Quantum well active layer 18 is therefore pseudomorphic, minimizing dislocations in the light-emitting region of laser diode 10. The maximum pseudomorphic thicknesses for strained epitaxial layers such as 18 depends on the composition and can be calculated from formulae described in Matthews et al., *Defects In Epitaxial Multilayers*, J. Crystal Growth, vol. 27, p. 118 (1974). The inclusion of quantum well layer 18, which could also be a pseudomorphic layer of other semiconductor material such as ZnSeTe, facilitates the low threshold current operation of laser diode 10 when positioned within the thicker, low-loss II-VI waveguide. The waveguide can be made with higher refractive index light-guiding layers 14 and 16 and lower refractive index cladding layers 20 and 22 which can have a relatively small difference in their band gaps and need not be exactly lattice matched. The composition of the light-guiding layers may be graded to minimize dislocations and/or to form a graded index waveguide.

Figure 2:
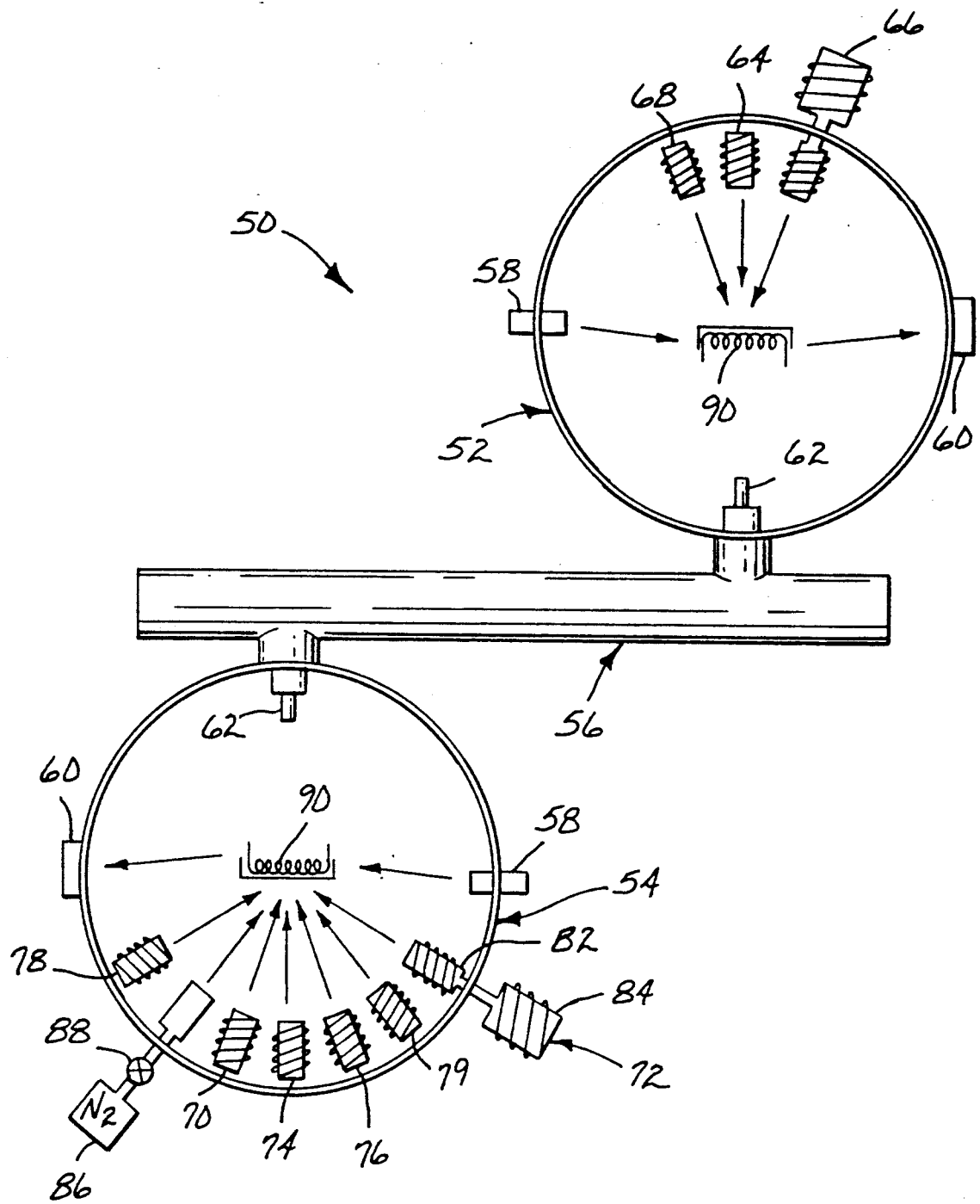
FIG. 2 is a schematic illustration of a molecular beam epitaxy system used to fabricate the laser diode and p-type contact layer shown in FIG. 1.

FIG. 2 is an illustration of a molecular beam epitaxy (MBE) system 50 used to fabricate the laser diode 10 described above. MBE system 50 includes two MBE chambers 52 and 54 interconnected by ultrahigh vacuum (UHV) pipeline 56. Each chamber 52 and 54 includes a high energy electron gun 58, a phosphorus screen 60, a substrate heater 90 and a flux monitor 62. MBE chambers such as 52 and 54 are generally known and commercially available. A Perkin-Elmer Model 430 MBE system was used to produce the prototype laser diodes 10.

MBE chamber 52 is used to grow the GaAs buffer layer 28 on substrate 12 and includes a Ga effusion cell 64 and an As cracking cell 66. A Si effusion cell 68 is also provided as a source of n-type dopants. Substrate 12 is cleaned and prepared using conventional or otherwise known techniques, and mounted to a Molybdenum sample block (not shown in FIG. 2) by In solder before being positioned within chamber 52. By way of example, substrate preparation techniques described in the Cheng et al. article *Molecular-Beam Epitaxy Growth Of ZnSe Using A Cracked Selenium Source*, J. Vac. Sci. Technol., B8, 181 (1990) were used to produce the prototype laser diode 10. The Si doped buffer layer 28 can be grown on substrate 12 by operating MBE chamber 52 in a conventional manner, such as that described in *Technology and Physics of Molecular Beam Epitaxy*, ed. E. H. C. Parker, Plenum Press, 1985. The resulting buffer layer 28 has an As-rich surface which exhibited a c(4×4) reconstruction as observed by reflection high energy electron diffraction (RHEED). The sample block bearing the GaAs substrate 12 and buffer layer 28 is then transferred to MBE chamber 54 through UHV pipeline 56 for further processing.

Device layers 24, 20, 14, 18, 16, 22, and 26 are all grown on the buffer layer 28 and GaAs substrate 12 within MBE chamber 54. To this end, chamber 54 includes a Zn effusion cell 70, cracked-Se effusion cell 72, ZnS effusion cell 74 (as a source of S), Cd effusion cell 76 and a standard Se (i.e., primarily $Se_6$) effusion cell 79. As shown, cracked-Se effusion cell 72 includes a bulk evaporator 84 and high temperature cracking zone 82, and provides a source of cracked Se (including $Se_2$ and other Se molecules with less than 6 atoms). The bulk evaporator 84 and high temperature cracking zone 82 used to produce the prototype laser diodes 10 are of a custom design, the details and capabilities of which are described in the Cheng et al. J. Vac. Sci. Technol. article referenced above. Cl effusion cell 78 which utilizes $ZnCl_2$ source material provides the Cl n-type dopant. The p-type dopant is provided by N free-radical source 80. Free-radical source 80 is connected to a source 86 of ultra-pure $N_2$ through leak-valve 88. The free-radical source 80 used in the fabrication of laser diodes 10 is commercially available from Oxford Applied Research Ltd of Oxfordshire, England (Model No. MPD21). This source has a length of 390 mm. The beam exit plate at the end of the source is made of pyrolytic boron nitride (PBN) and has nine 0.2 mm diameter holes through it. This source is mounted on a standard port for an effusion cell through a 10" extension tube. $N_2$ source 86 used to fabricate laser diodes 10 is of research purity grade, produced by Matheson Gas Products. The pressure at the inlet of the leak-valve of source 86 is 5 psi.

MBE chamber 54 is operated in a manner described in the Cheng et al. article *Growth Of p- and n- Type ZnSe By Molecular Beam Epitaxy*, J. Crystal Growth 95, 512 (1989) using the $Se_6$ source 79 as the source of Se to grow the p-type contact, cladding and light-guiding layers 24, 20 and 14, respectively, of the prototype laser diode 10. Quantum well active layer 18 is grown in a manner described in the Samarth et al. article, *Molecular Beam Epitaxy of CdSe and the Derivative Alloys $Zn_{1-x}Cd_xSe$ and $Cd_{1-x}Mn_xSe$*, J. Electronic Materials, vol. 19. No. 6, p. 543 (1990).

MBE chamber 54 is operated in a manner described in the copending Park et al. U.S. Patent Application Ser. No. 07/573,428, entitled Doping Of IIB-VIA Semiconductors During Molecular Beam Epitaxy and filed on Aug. 24, 1990, using the $Se_6$ source 79 to grow the p-type light-guiding layer 16 and cladding layer 22. The disclosure contained in the above-reference U.S. patent application Ser. No. 07/573,428 is reproduced immediately below.

An atomic dopant beam (either nitrogen or oxygen), produced by a free-radical source, is used to dope ZnSe during molecular beam epitaxy which produces p-type ZnSe epitaxial thin films. When electromagnetic power at the frequency of 13.52 MHz is coupled to an RF plasma discharge chamber of the free-radical source, atomic dopant species are generated inside the chamber of the free-radical source from a gaseous source of ultra-high purity. A diffuser plate having 18 holes of about 0.3 mm diameter each was used to separate the free-radical source and the molecular beam epitaxy chamber. The amount of the atomic dopant species generated is controlled by the level of the RF power coupled to, and the pressure in the RF plasma discharge chamber. The atomic dopant species, which effuse into the molecular beam epitaxy chamber through openings in the diffuser plate, are used as the dopants during the molecular beam epitaxy growth of ZnSe.

In one embodiment, ZnSe thin layers are grown on a well-polished GaAs surface with the surface normal vector essentially along the [001] crystal orientation. There are many suppliers of either the GaAs substrate, available from, for example, Sumitomo Electric Industries, Ltd., 1—1 Koyakita 1-Chome, Itami, Hyogo, 664 Japan, or the GaAs epitaxial layer, available from Spire Corporation, Patriots Park, Bedford, Mass., 01730, for this purpose. Before loading into the molecular beam epitaxy system for the ZnSe growth, the GaAs substrates are degreased in trichloroethane, acetone, and isopropanol, rinsed in deionized water and blown dry by high purity nitrogen gas. The degreased substrates are chemically etched in a solution consisting of six parts of sulfuric acid, one part of hydrogen perioxide and one part of deionized water for several minutes (about two to five minutes). The substrate is rinsed in deionized water and blown dry by high purity nitrogen gas. The degreased and chemically-etched GaAs substrates are then attached to a Mo sample block using molten In of high purity as solder. The substrate assembly is immediately loaded into the molecular beam epitaxy system. The GaAs substrates are heated in the ultra-high vacuum growth chamber to about 610° C. for about one to five minutes to desorb the native oxides and expose the underlying crystalline structure on which the ZnSe with the same crystal structure is to be grown. The typical growth conditions for ZnSe by molecular beam epitaxy are a Zn to Se beam equivalent pressure ratio of 1:2 (in the range of about 1:4 to 2:1) and a growth temperature of 275° C. (in the range of about 250° C. to 400° C.). Typical layer thicknesses and growth rates are 2 $\mu$m and 0.5 $\mu$m/h (in the range of about 0.4 $\mu$m/h to 2.0 $\mu$m/h) respectively. The atomic dopants generated by the free-radical source are incorporated into the ZnSe by opening the mechanical shutter which blocks the line of sight path between the free-radical source and the heated substrates.

The major focus in recent years regarding research on the wide-bandgap IIB-VIA compound semiconductor, ZnSe ($E_g \simeq 2.67$ eV at room temperature), has been on producing low resistivity p-type material. The present invention utilizes a method and apparatus for the in-situ production of epitaxial structures comprising ZnSe pn junctions. This is useful in the fabrication of efficient light-emitting devices, such as light-emitting diodes and diode lasers which operate in the blue region of the visible spectrum.

Either nitrogen or oxygen are an excellent p-type dopant element in ZnSe. In addition to providing large net acceptor densities (greater than about $5 \times 10^{15} cm^{-3}$ and low compensation ($N_D/N_A$ less than about 0.8), nitrogen and oxygen are stable in ZnSe at temperatures up to 375° C.

Large concentrations of net nitrogen acceptor impurities are incorporated into ZnSe/GaAs epitaxial layers which involves nitrogen atom beam doping during molecular beam epitaxial growth. Net acceptor densities as large as $4.9 \times 10^{17} cm^{-3}$ have been measured in the resultant p-type ZnSe material.

Figure 9:
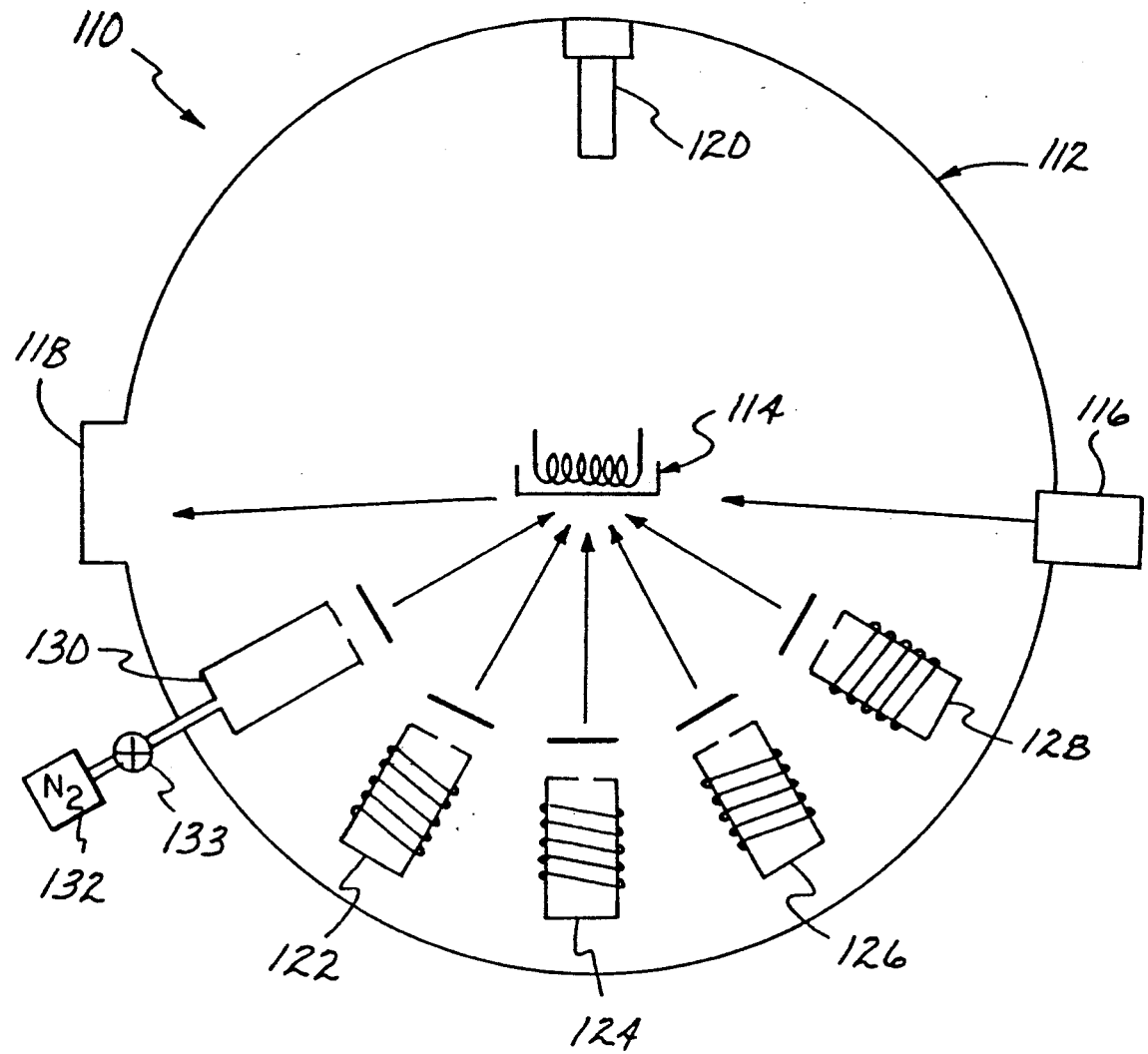
FIG. 9 is a diagram of a molecular beam epitaxy chamber for doping semiconductors in accordance with the present invention.

FIG. 9 shows a molecular beam epitaxy system 10. Molecular beam epitaxy system 110 includes a molecular beam epitaxy chamber 112 which encloses a substrate 114. Molecular beam epitaxy chamber 112 includes an electron gun 116, a phosphorus screen 118 and a flux monitor 120. Effusion cells 122, 124, 126, and 128 are carrie din molecular beam epitaxy chamber 112. Effusion cells 122, 124, 126, and 128 may comprise, for example, effusion cells for Zn, Se, and $ZnCl_2$. Molecular beam epitaxy system 10 also includes a free-radial source 130. Free-radical source 130 may comprise a source of any group VA or oxygen free-radicals. For example, free-radical source 130 may provide a source of nitrogen free-radicals, in which free-radical source 130 is supplied with ultra-pure $N_2$ from an ultra-pure $N_2$ source 132 through a valve 133. Free-radical source 130 is available from Oxford Applied Research Ltd. (Oxfordshire, UK). Free-radical source 130 might comprise other types of sources which produce free-radicals. For example, an electron cyclotron resonance (ECR) free-radical source may be used (available from, for example, Wavemat, Inc., 44780 Helm Street, Plymouth, Mich.). A microwave cracker coupled into the gas source through a microwave tube may be used to produce free-radicals. A DC plasma discharge chamber may also be used. Furthermore, any appropriate thermal cracker or disassociation cell (available from, for example, EPI, 261 East Fifth Street, St. Paul, Minn. 55101) may be used.

ZnSe layers were grown on GaAs substrates in a molecular beam epitaxy system of the type described herein. These layers were grown at a substrate temperature 275° C. with a Zn to Se beam equivalent pressure ratio of 1:2 (typical layer thicknesses and growth rates were 2 $\mu$m and 0.5 $\mu$m/h, respectively). P-type doping of the ZnSe layers was achieved by a free-radical source which was incorporated in the molecular beam epitaxy system, rather than a conventional effusion source. The free-radical source provided a flux of atomic nitrogen (together with a much larger flux of non-dissociated $N_2$) created in a RF plasma discharge chamber. A RF frequency of 13.5 MHz was used to generate nitrogen atoms from a gaseous source of ultra-pure $N_2$. The atomic nitrogen flux level was controlled by suitably adjusting the intensity of the RF plasma discharge.

The nitrogen actively incorporated into the ZnSe was much greater using the free-radical atomic beam than that of molecular nitrogen, as evidenced by comparing 10K photoluminescence (PL) spectra recorded from ZnSe layers grown with a flux of $N_2$ only and with a flux of $N+N_2$. As shown in FIG. 10($a$), the 10K PL spectrum recorded from a ZnSe layer grown using a flux of $N_2$ only, (in this case an equilibrium background pressure of $N_2$ in the molecular beam epitaxy chamber of $5 \times 10^{-7}$ Torr was maintained) appears to be identical to that recorded from undoped ZnSe heteroepitaxial layers (see R. M. Park, C. M. Rouleau, M. B. Troffer, T. Koyama, and T. Yodo, J. Mater. Res., 5, 475 (1990)). The dominant peaks in the excitonic regime are the split free-exciton ($E_x$) and donor-bound-exciton ($I_2$) transitions, the splitting being due to the thermal expansion coefficient mismatch between ZnSe and GaAs which renders the ZnSe layers under in-plane biaxial tension (see K. Shahzad, D. J. Olego, D. A. Cammack, Phys. Rev. B 39, 13016 (1989)). Consequently, at such low background $N_2$ partial pressures, molecular nitrogen is completely unreactive at the ZnSe surface. The situation changes dramatically, however when a plasma discharge is created in the free-radical source, as shown in the 10K spectrum of FIG. 10($b$). Again the background $N_2$ partial pressure in the molecular beam epitaxy chamber during growth was $5 \times 10^{-7}$ Torr with power applied to the RF plasma discharge. The excitonic regime is dominated by split acceptor-bound-exciton ($I_1^N$) transitions due to the incorporation of nitrogen acceptor impurities (see P. J. Dean, W. Stutius, G. F. Neumark, B. J. Fitzpatrick, and R. N. Bhargava, Phys. Rev. B 27, 2419 (1983)). In addition, the complete PL spectrum is dominated by donor-to-acceptor (D-A) transitions ($Q_O^N$-represents the no phonon transition, with several LO phonon replicas of $Q_O^N$ also indicated) as opposed to excitonic transitions. Thus, the rate of substitutional incorporation of atomic nitrogen is much greater than that of molecular nitrogen at the growing ZnSe surface. The sample from which the PL spectrum shown in FIG. 10(b) was obtained was found to have a net acceptor concentration of $1 \times 10^{17} cm^{-3}$.

Net acceptor concentrations, $N_A-N_D$, in the nitrogen doped ZnSe/GaAs layers were determined using capacitance-voltage (C-V) profiling. Since the ZnSe epitaxial layers were grown on semi-insulating GaAs, planar profiling between two Schottky contacts on the ZnSe surface was carried out. The surface contact pattern consisted of a series of 762 μm diameter Cr/Au dots physically isolated from a large Cr/Au surrounding electrode. The separation between the inner (dot) electrodes and the outer electrode was 25 μm, a small separation being necessary in order to maintain a low series resistance. The contact pattern was created by thermally evaporating 75 Å of Cr followed by 1000 Å of Au and performing photolithographic and lift-off processes. In all of these measurements the outer electrode was held at ground potential and bias was applied to the inner Schottky contact.

Figure 11A:
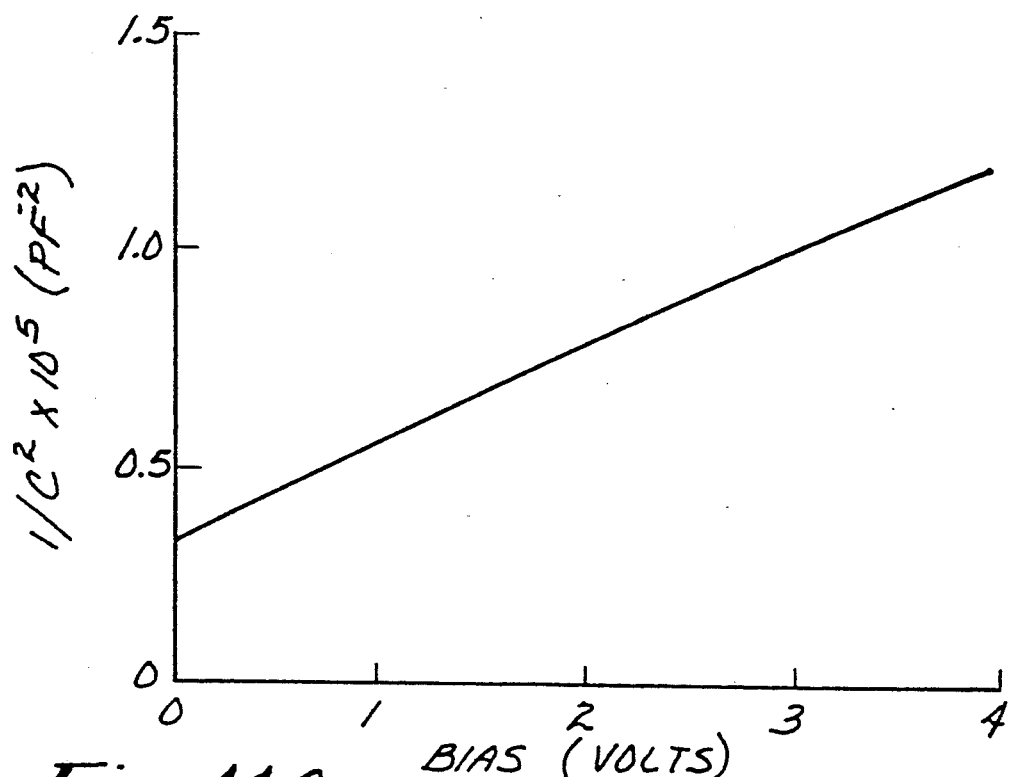
FIG. 11(a) is a graph of $1/C^2$ versus bias voltage for a semiconductor sample described in the Detailed Description Of The Preferred Embodiments.
Figure 11B:
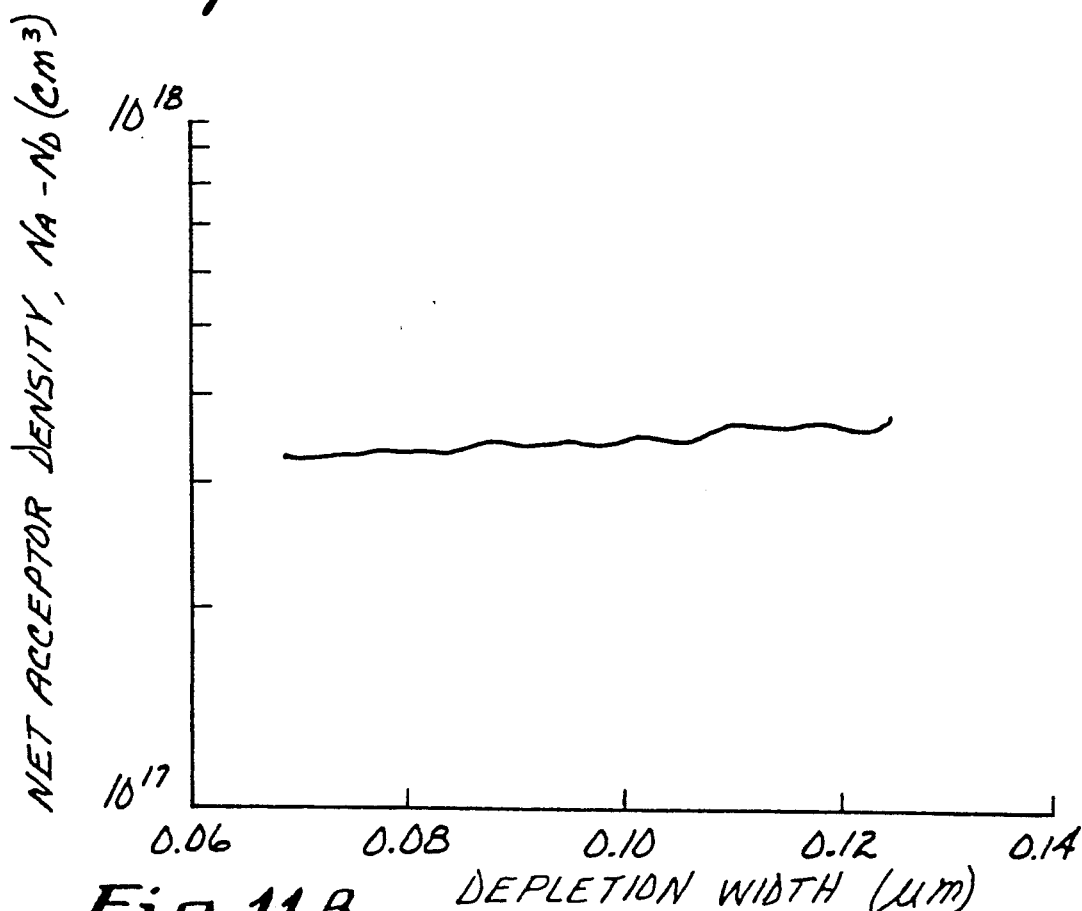
FIG. 11(b) is a graph of a net acceptor density versus depletion width for a semiconductor described in the Detailed Description Of The Preferred Embodiments.

With this sign convention the majority carrier type is given by the sign of the slope of the $1/C^2$ versus V plot; a positive slope would indicate the material to be p-type. The net acceptor ($N_A-N_D$) concentration is proportional to the slope of $1C^2$ versus V. The $1/C^2$ versus V plot and the $N_A-N_D$ versus depletion width profile obtained from a heavily-doped ZnSe layer are illustrated in FIGS. 11(a) and 11(b), respectively. As shown in FIGS. 11(a) and 11(b), the material is p-type with a net acceptor concentration around $3.4 \times 10^{17} cm^{-3}$. As shown in FIG. (b), the doping profile is rather flat from zero bias (0.068 μm) out to where reverse bias breakdown occurs (1.126 μm). Breakdown occurred at 3.8 V which is consistent with avalanche breakdown in ZnSe material doped at this level, i.e., $3.4 \times 10^{17} cm^{-3}$ p-type.

Further evidence of the p-type nature of the nitrogen doped ZnSe material was obtained through the fabrication of blue light-emitting diodes based on epitaxially grown ZnSe:N/ZnSe:Cl pn homojunctions. The n-type ZnSe layers in these pn junctions were grown using Cl as the dopant element, the source of the Cl atoms being a $ZnCl_2$ effusion cell incorporated in the molecular beam epitaxy system.

A number of ZnSe samples grown using molecular beam epitaxy were tested. The results were as follows:

1. Undoped ZnSe:
   Zn to Se beam equivalent pressure ratio: 1:2
   Growth Temperature: 275° C.
   Results: Low temperature photoluminescence spectrum indicated sample was not p-type. C-V measurement indicated sample was insulating.
2. Doped ZnSe using $N_2$ with no RF power to free-radical source:
   Zn to Se beam equivalent pressure ratio: 1:2
   Growth Temperature: 275° C.
   RF power: 0 watts
   Background pressure: $5 \times 10^{-7}$ Torr
   Results: Low temperature photoluminescence spectrum indicated sample was not p-type. C-V measurements indicated sample was insulating.
3. Doped ZnSe using $N_2$ with RF power to free-radical source:
   Zn to Se beam equivalent pressure ratio: 1:2
   Growth temperature: 275° C.
   RF power: 320 watts
   Background pressure: $5 \times 10^{-7}$ Torr
   Results: Low temperature photoluminescence spectrum, current-voltage measurement and capacitance-voltage measurement indicated that sample was p-type. $N_D/N_A \leq 0.8$ (high doping efficiency) and $N_A-N_D = 3.4 \times 10^{17} cm^{-3}$.
4. Doped ZnSe using $O_2$ with RF power to free-radical source:
   Zn to Se beam equivalent pressure ratio: 1:2
   Growth temperature: 275° C.
   RF power: 320 watts
   Background pressure: $5 \times 10^{-7}$ Torr
   Results: Low temperature photoluminescence spectrum, current-voltage measurement, and capacitance-voltage measurement indicated that sample was p-type and $N_A-N_D = 3.0 \times 10^{16} cm^{-3}$.

Figures 12A, 12B:
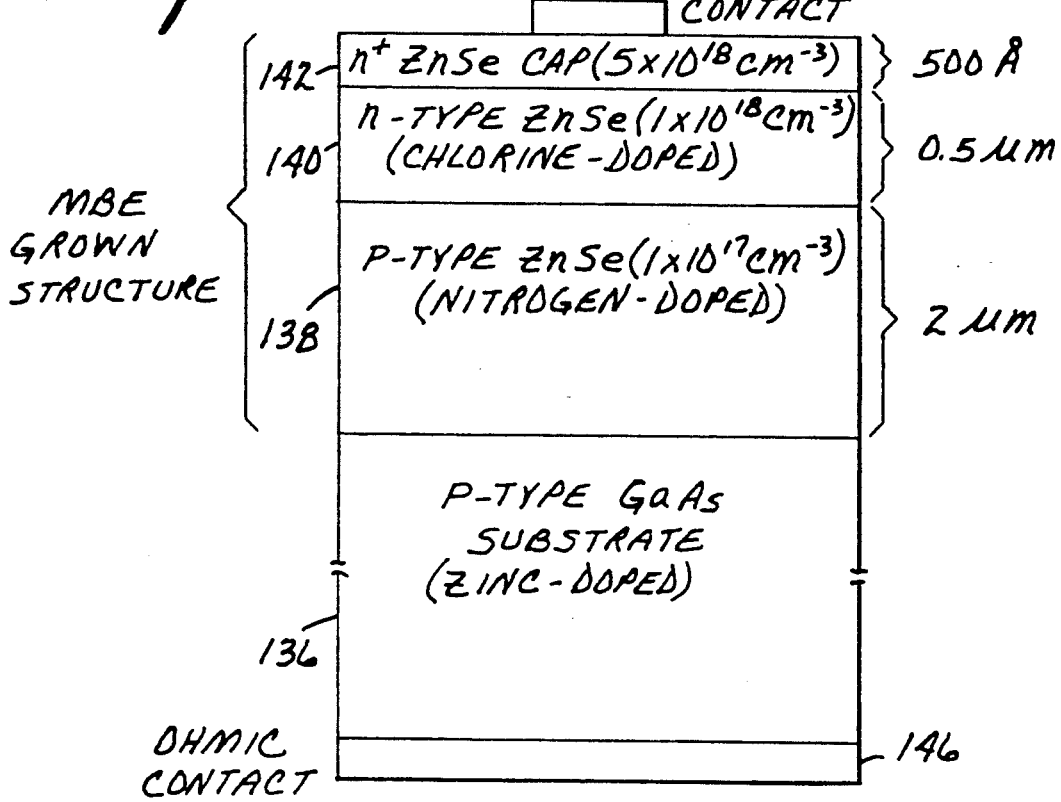
FIG. 12(a) is a cross sectional view (not to scale) of a light emitting diode described in The Detailed Description Of the Preferred Embodiments.
FIG. 12(b) is a graph of the EL intensity versus wavelength relationship of the light emitting diode shown in FIG. 12(a) at 77K.

FIG. 12(a) shows a light emitting diode 134. Light emitting diode 134 includes a p-type GaAs substrate 136. P-type GaAs substrate 136 forms the base for molecular beam epitaxial growth. A p-type ZnSe nitrogen doped layer 138 is deposited upon p-type GaAs substrate 136. P-type ZnSe layer 138 is deposited in accordance with the present invention using a nitrogen free-radical source. As n-type ZnSe chlorine doped layer 140 is deposited upon p-type ZnSe layer 138. An n+ ZnSe cap layer 142 is deposited upon n-type ZnSe layer 140. The deposition of layers 138, 140, and 142 is through molecular beam epitaxial growth. Ohmic contacts 144 and 146 form electrical contacts to n+ ZnSe cap layer 142 and p-type GaAs substrate 136, respectively.

In one embodiment, p-type ZnSe layer 138 has a thickness of 2 μm and has a net acceptor concentration of $1 \times 10^{17} cm^{-3}$. N-type ZnSe layer 140 has a thickness of 0.5 μm and a net donor concentration of $1 \times 10^{18} cm^{-3}$. The n+ ZnSe cap layer 142 has a thickness of 500 Å and a net donor concentration of $5 \times 10^{18} cm^{-3}$.

FIG. 12(a) shows the p-type ZnSe layer is grown first on a p+-type GaAs substrate. This type of "buried p-type layer" structure avoids the serious problems associated with ohmic contact formation to p-type ZnSe (See M. A. Haase, H. Cheng, J. M. DePuydt, and J. E. Potts, J. Appl. Phys., 67, 448 (1990)). However, a disadvantage with this device design is that a large hole barrier exists at the p+-GaAs/p-ZnSe hetero-interface (see L. Kassel, H. Abad, J. W. Garland, P. M. Raccah, J. E. Potts, M. A. Haase, and H. Cheng, Appl. Phys. Lett., 56 42 (1990)). In this type of device, hole injection across the p+-GaAs/p-ZnSe hetero-interface is only realized at avalanche breakdown. Consequently, large turn-on voltages are required to observe electroluminescence associated with the ZnSe pn homojunction.

Light-emitting diode fabrication was accomplished using conventional photolithographic techniques with device isolation being achieved by wet chemical etching to form 400 μm diameter mesas. The top electrode metallization was ring shaped and was patterned by vacuum evaporation and lift-off. Ultrasonic gold ball bonding was used to make contact to the devices for electroluminescence characterization.

A typical electroluminescence spectrum recorded at 77K for light emitting diode 134 shown in FIG. 12(a), is illustrated in FIG. 12(b). The device operating voltage and current were 13.5 V and 40 mA, respectively, for the spectrum shown in FIG. 12(a). As can be seen from FIG. 12(b), the visible electroluminescence is dominated by blue emission, the spectrum comprising a number of resolved lines principally at 447.7 nm, 459.6 nm and 464.7 nm. The two highest energy peaks in the spectrum correspond closely in energy to the electroluminescence peaks observed at 77K from blue light-emitting diodes fabricated using a nitrogen-ion implantation and annealing procedure as reported by Akimoto et al (See K. Akimoto, T. Miyajima, and Y. Mori, Jpn. J. Appl. Phys., 28, L528 (1989)). Infrared emission at 844 nm was also recorded from these devices (simultaneously with the blue emission) which appears to be the result of electron injection into the p+-type GaAs material under avalanche breakdown conditions at the hetero-junction (not shown in FIG. 12(b)).

Figure 13:
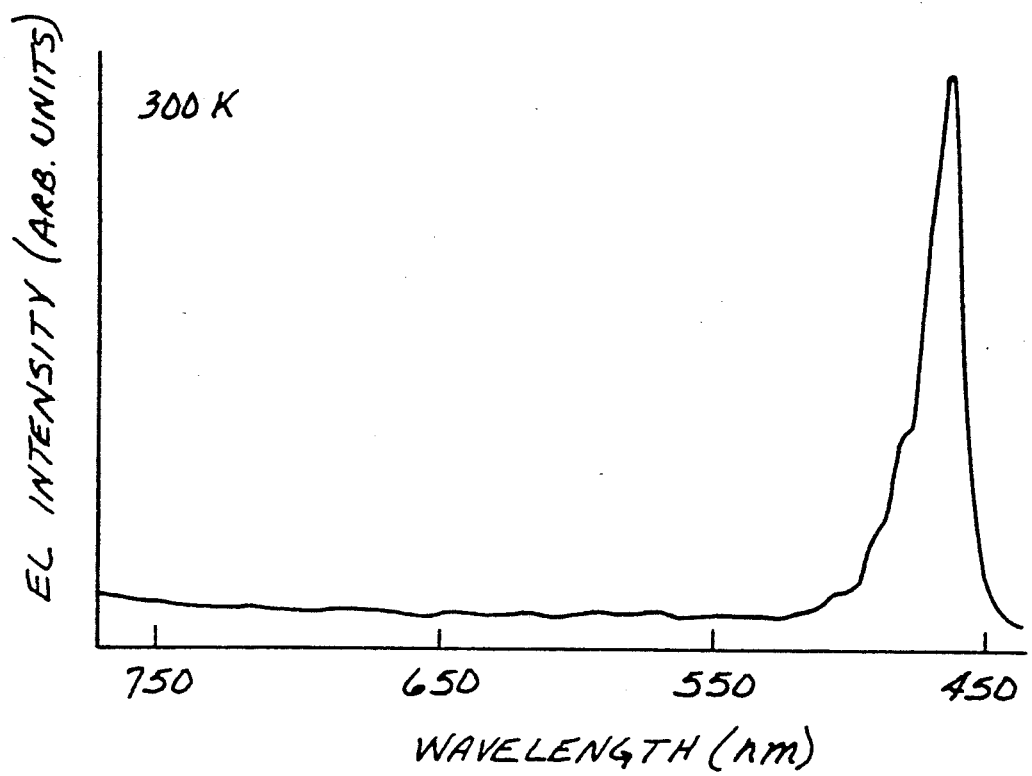
FIG. 13 is a graph of the EL intensity versus wavelength relationship for the light emitting diode shown in FIG. 12(a) at room temperature.

An electroluminescence spectrum recorded at room temperature from the device structure illustrated in FIG. 12(a) (visible region only) is shown in FIG. 13. As can be seen from the figure, dominant emission in the blue region of the visible spectrum is observed, peaking in intensity at a wavelength of 465 nm. For the particular spectrum shown in FIG. 13, the voltage applied and current drawn were 22 V and 20 mA, respectively.

Figure 14:
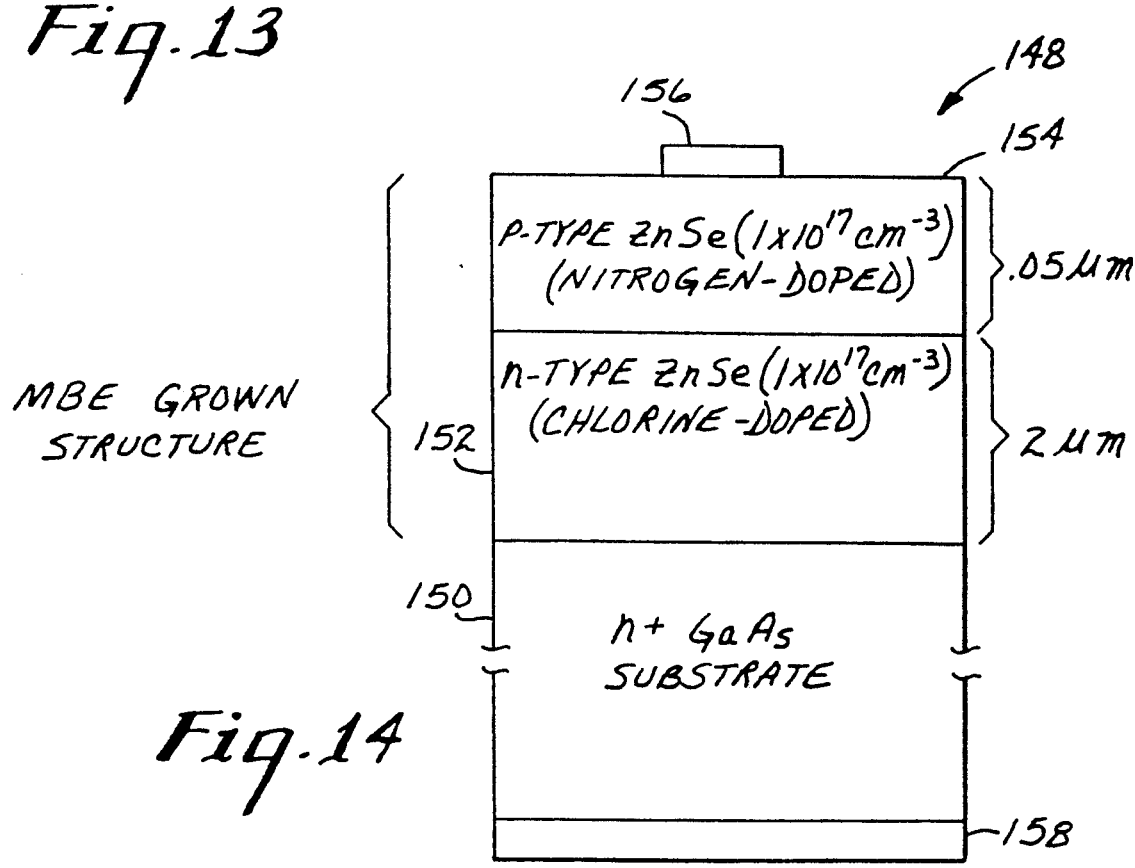
FIG. 14 is a cross sectional view (not to scale) of a second light emitting diode described in the Detailed Description Of The Preferred Embodiments.

FIG. 14 shows a light emitting diode 148. Light emitting diode 148 is a p on n device which operates similar to light emitting diode 134 of FIG. 12(a). Light emitting diode 148 includes an n+ GaAs substrate 150, an n-type ZnSe layer 152 and p-type ZnSe layer 154. Contacts 156 and 158 make electrical contact with p-type ZnSe layer 154 and n+ GaAs substrate 150. The p-type ZnSe layer 154 is deposited using molecular beam epitaxy and a group VA free-radical source described above. In one embodiment, diode 148 shown in FIG. 14 n-type ZnSe layer 152 has a net donor concentration of about $1 \times 10^{18} cm^{-3}$ and a thickness of about 2.0 μm and p-type ZnSe layer 154 has a net acceptor concentration of about $1 \times 10^{17} cm^{-3}$ and a thickness of 0.5 μm.

Using the method and apparatus descried above, n-type IIB-VIA semiconductor film may also be produced. The resultant IIB-VIA semiconductor film may be used in pn junction devices such as light emitting diodes and light detectors as well as diode lasers and transistors. The free-radical source is introduced into a molecular beam epitaxy growth chamber to provide a dopant to a IIB-VIA semiconductor during molecular beam epitaxial growth. The free-radical source may be nitrogen, phosphorus, arsenic, and antimony. Oxygen may also be used as a suitable free-radical source. The method and apparatus may be used for N-doping and O-doping of ZnSe. P-type ternary IIB-VIA semiconductors including $Zn_{1-x}Cd_xSe$, $ZnSe_{1-x}Te_x$, $ZnSe_{1-x}S_x$, $ZnS_{1-x}Te_x$, and $Zn_{1-x}Cd_xS$. *Molecular Beam Epitaxy of CdSe and the Derivative Alloys $Zn_{1-x}Cd_xSe$ and $Cd_{1-x}Mn_xSe$*, J. Electronic Materials, vol. 19. No. 6,p. 543 (1990).

MBE chamber 54 is operated in a manner described in the copending Park et al. U.S. patent application Ser. No. 07/573,428, entitled Doping Of IIB-VIA Semiconductors During Molecular Beam Epitaxy and filed on Aug. 24, 1990, using the $Se_6$ source 79 to grow the p-type light-guiding layer 16 and cladding layer 22. The disclosure contained in the above-referenced U.S. patent application Ser. No. 07/573,428 is Lower ZnSSe cladding layer 20 is doped n-type using the $ZnCl_2$ source. Other aspects of the techniques used to grow cladding layers 20 and 22 are described in the Matsumura et al. article, *Optimum Composition In MBE-$ZnS_xSe_{1-x}/ZnSe$ For High Quality Heteroepitaxial Growth*, J. Crys. Growth, vol. 99, p. 446 (1990).

A low resistivity p-type ZnSe ohmic contact layer 26 has been achieved by growing the contact layer at low temperature within MBE chamber 54 utilizing the cracked Se source 72 (i.e., cracking zone 82 and evaporator 84), while at the same time doping the semiconductor material of the contact layer p-type in accordance with the above-referenced U.S. patent application Ser. No. 07/573,428. The low temperature growth technique used to produce the contact layer 26 of the prototype laser diode 10 is described generally in the Cheng et al. article *Low Temperature Growth Of ZnSe By Molecular Beam Epitaxy Using Cracked Selenium*, Appl. Phys. Lett. (February 1990). The semiconductor body with layers 28, 24, 20, 14, 18, 16 and 22 on substrate 12 is heated to a temperature less than 250° C. but high enough to promote crystalline growth of the ZnSe doped with the N p-type dopants to a net acceptor concentration of at least $1 \times 10^{17} cm^{-3}$. A net acceptor concentration of $1 \times 10^{17} cm^{-3}$ was achieved in the ohmic contact layer 26 of prototype laser diodes 10, when grown at a substrate temperature of about 150° C. However, it is anticipated that ohmic contact layers 26 with acceptable characteristics can be achieved at other growth temperatures down to at least 130° C. Other operating parameters of MBE chamber 54 used to produce the ohmic contact layer 26 of the prototype laser diodes 10 are as follows:

| | |
|---|---|
| Zn beam equivalent pressure: | $1.0 \times 10^{-7}$ Torr* |
| Se cracking zone temperature: | 600° C.* |
| Se bulk evaporator temperature: | 250° C.* |
| Growth rate: | 0.3–0.6 μm/hr |
| Surface reconstruction: | Zn-stabilized |
| Nitrogen pressure in chamber: | $>3.5 \times 10^{-7}$ Torr* |
| rf power: | 150–250 W* |

*parameters dependant upon specific MBE system configuration

Figure 3:
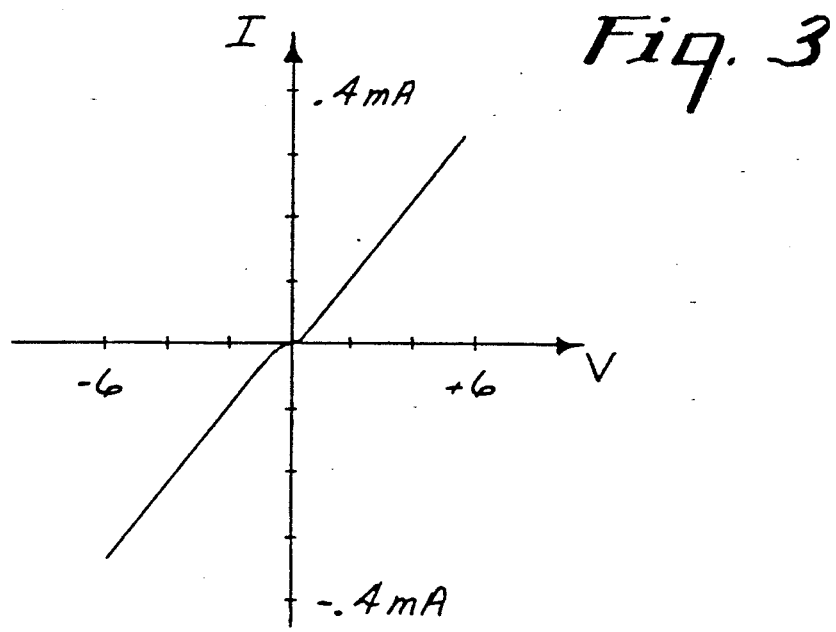
FIG. 3 is a graph of the I-V characteristic of sample Au ohmic contacts on p-type ZnSe in accordance with the present invention.

FIG. 3 is the current-voltage characteristic of a sample with two coplanar Au metal electrodes on a p-type ZnSe contact layer produced for test purposes in a manner substantially similar to that described above. The ohmic nature of this contact is indicated by the substantially linear nature of the curve over the −6 to +6 volt range.

Figure 4:
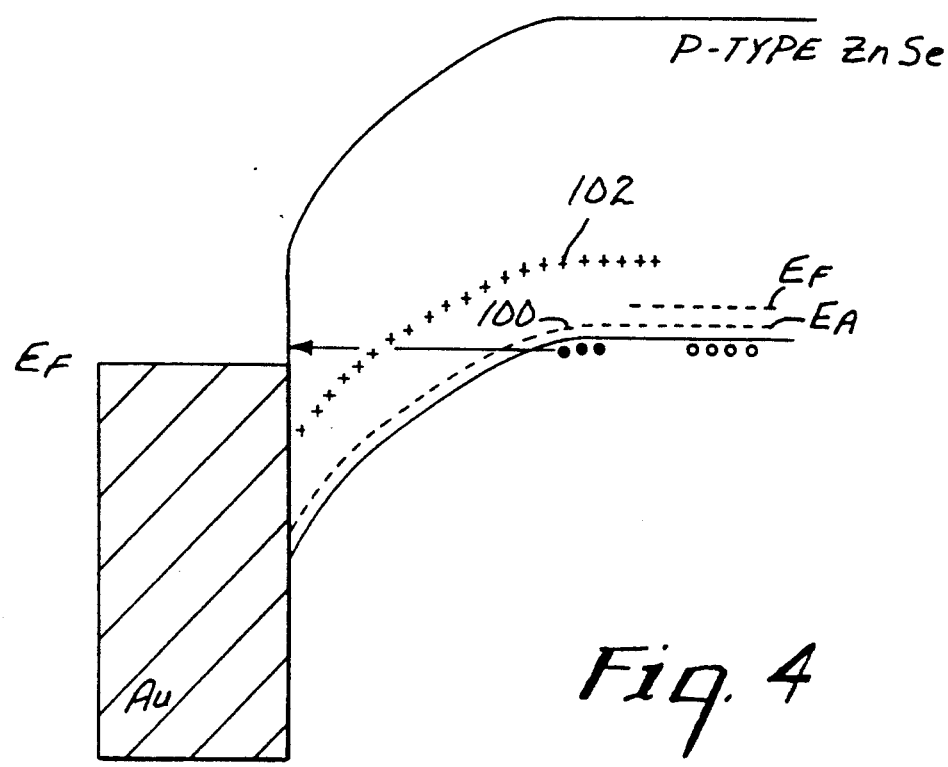
FIG. 4 is an energy band diagram of an ohmic contact in accordance with the present invention.

The mechanisms believed to enable the ohmic nature of contact layer 26 can be described with reference to FIG. 4 which is an energy band diagram of the Au - p-type ZnSe contact layer interface. In addition to the expected shallow impurities 100 utilized by conventional ohmic contacts, additional electronic energy states 102 are formed in the contact layer. These additional energy states 102 are relatively deep (within the forbidden gap) with respect to the valence band maximum, compared to the depth of the shallow impurity level 100. Energy states 102 are in effect intermediate energy states located at an energy less than the Au Fermi level and greater than the shallow impurity level 100. Since the probability of charge carriers tunneling between two given energy states increases exponentially with decreasing distance between the two states, additional energy states 102 greatly increase the tunneling probability by providing a temporary residence for the carriers and facilitate multi-step or cascade tunneling. The optimum condition is illustrated in FIG. 4 where $E_F$ is the Fermi energy and $E_A$ is the acceptor energy. A diagramatic depiction of an electron making a multi-step tunneling transfer between the ZnSe and Au layers through the additional energy states 102 is also shown in FIG. 4. Even better contacts are attainable with electronic states at more than one energy level, such that tunneling can occur from state to state across the barrier.

It is anticipated that the introduction of additional energy states 102 can be achieved by a number of methods. Doping during growth, diffusion, ion implantation or other known techniques can be used to incorporate impurities which produce deep levels. One important type of deep level impurity is the iso-electronic trap. By way of example, Te is thought to form a hole trap in ZnSe. The additional energy states 102 can also be achieved by introducing proper native crystal defects such as, but not limited to, dislocations, vacancies, interstitials or complexes into contact layer 26. This can be done during the deposition of the contact layer by choosing the molecular species of the precursors, and/or by other appropriate growth conditions. Native defects can also be generated by post-growth treatments such as irradiation by electron beams, ion beams, radical beams or electromagnetic radiation. However, these techniques must be implemented without detrimentally degrading the conductivity of the ZnSe or other semiconductor material used for the contact layer.

It therefore appears that the useful p-type contact layer 26 has a number of properties. The net acceptor density $N_A-N_D$ is large, preferrably at least $1 \times 10^{18} cm^{-3}$. This serves to reduce the width of the barrier through which the charge carriers must tunnel. The p-type dopant concentration (nitrogen in laser diode 10) must also be large, preferrably at least $1 \times 10^{17} cm^{-3}$. In addition to forming the shallow acceptor levels, the nitrogen impurities also appear to participate in the formation of the deep energy states. At a minimum, the amount of nitrogen required is that which will provide adequate concentrations of both types of levels. The growth conditions must also be appropriate to form the defects at the energy levels described above. The low temperature growth technique described above has been shown to produce these material properties (contact resistances less than 0.4 ohm-$cm^2$ have been achieved).

Figure 8:
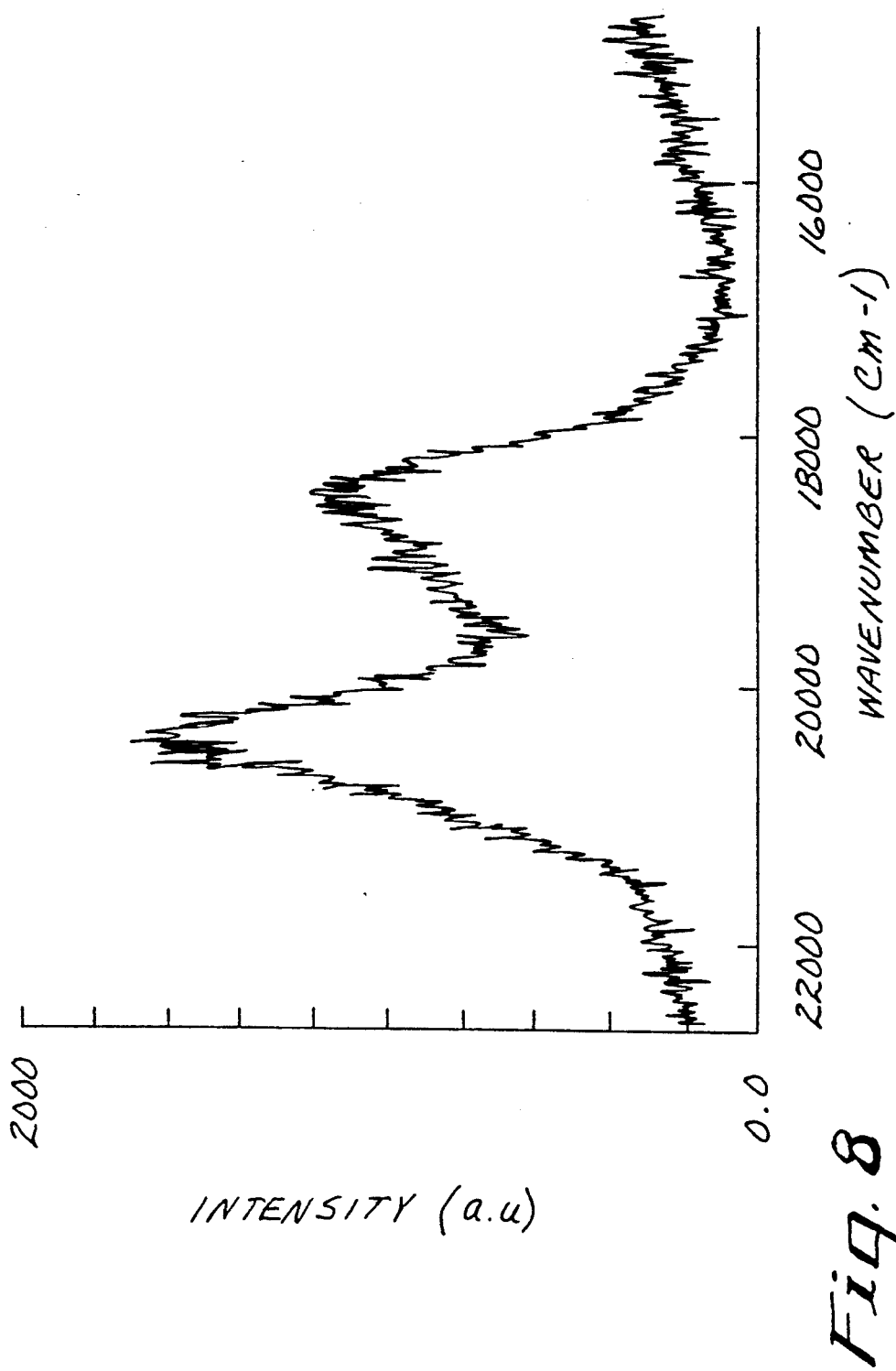
FIG. 8 is a graph of the low-temperature photoluminescence (PL) spectrum of the p-type ohmic contact layer sample in accordance with the present invention.

The low-temperature photoluminescence (PL) spectrum from a good ohmic contact layer such as 26 is shown in FIG. 8. The observed characteristics include: 1) the very weak near band edge PL; 2) the appearance of the defect band at 2.3 eV (18,500 $cm^{-1}$); and 3) the presence of a band (presumably associated with donor-acceptor-pair recombination) at about 2.5 eV (20,400 $cm^{-1}$). The band edge PL is expected to be weak for materials which have significant concentrations of deep levels since the deep levels provide long wavelength and non-radiative channels which compete with the near band edge processes. The emission band at approximately 2.3 eV is associated with a transition from the conduction band to a deep (acceptor) level about 0.5 eV above the valence band maximum. This is near the energy position that is believed to be the most effective for cascade tunneling. The emission band at 2.5 eV is believed to be related to transitions from donor to acceptor states. No or minimal donor states would be preferrable, eliminating this transition, or shifting its occurance to slightly higher energies.

In general, and other than the differences described below, conventional processes (i.e., those used for Si and III-V semiconductor devices) are used to complete the fabrication of prototype laser diode 10. Following the deposition of contact layer 26, the as yet incomplete laser diode 10 is removed from MBE chamber 54. Electrode 30 includes Au which is vacuum evaporated onto contact layer 26 and patterned into a stripe (typically about 20 μm wide) using conventional photolithography and lift-off. An insulating layer 34 of is then applied over electrode 30 and the exposed surface of contact layer 26. For an insulator that can be applied at low temperatures, polyimide photoresist is preferred. Probimide 408 from Ciba-Geigy Corp. was used to produce laser diode 10. A stripe (about 20 μm wide) of the polyimide layer 34 directly above electrode 30 is removed by UV exposure through a photomask and development using the manufacturer's recommended processing recipe, except for the post-development cure. To cure the developed polyimide, the device was flood exposed to 1 J/$cm^2$ of UV light from a mask aligner, and baked at 125° C. on a hot plate in air for 3 minutes. Ti-Au layer 31 is then evaporated on the exposed surface of the Au electrode 30 and polyimide layer 34 to facilitate lead-bonding. The In used for MBE substrate bonding also served as electrode 32 on substrate 12. Opposite ends of the device were cleaved along (110) planes to form facet mirrors. Cavity length of the prototype devices 10 is about 1000 μm. Laser diodes 10 were then bonded p-side up to ceramic sample holders with silver-filled epoxy.

Figure 7:
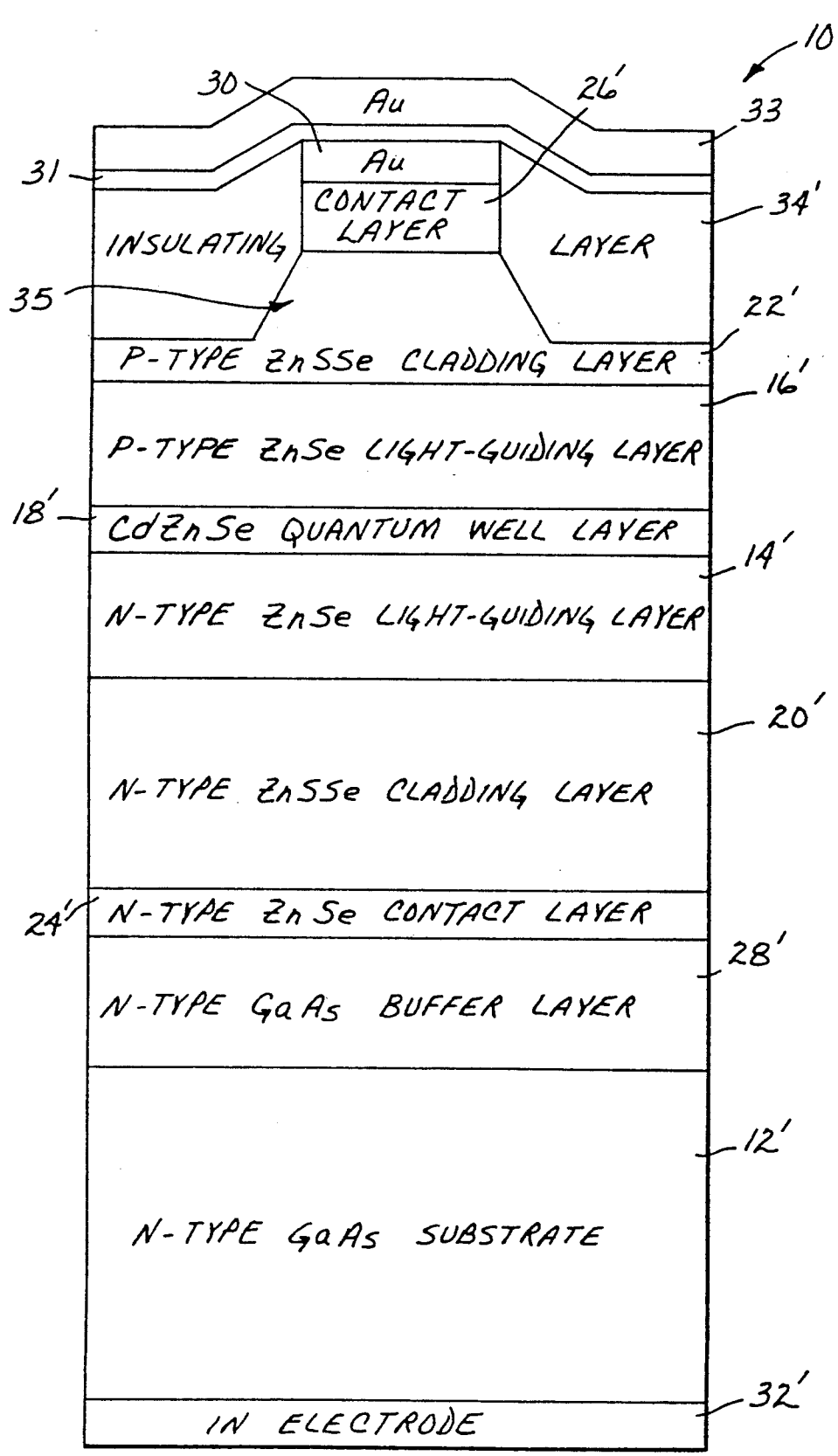
FIG. 7 is a cross sectional view (not to scale) illustrating the structure of an alternative rib waveguide embodiment of the laser diode shown in FIG. 1 which also includes an ohmic contact in accordance with the present invention.

Improved performance of these laser devices can be gained by providing better lateral confinement of the optical mode. This can be achieved by forming an index-guided laser 10' such as that shown in FIG. 7. Index-guided laser 10' is similar to laser 10 and can be fabricated with the same II-VI semiconductor layers. Portions of laser 10' which correspond to those of laser 10 are indicated with identical but primed (i.e., "X'") reference numerals. In the embodiment shown, laser 10' includes a waveguide or rib 35 in the cladding layer 22' and contact layer 26'. Rib 35 can be formed to a width of about 5 μm by ion beam etching with a Xe or Ar ion beam or by wet-chemical etching. Conventional photoresist can be used as a mask for this process. Other known and conventional techniques can also be used to provide lateral waveguiding. These techniques include using substrates in which grooves have been etched (i.e., channelled-substrate lasers), or etching a rib and re-growing a top cladding layer (i.e., a "buried heterostructure" laser). Improvements in the threshold current or the differential quantum efficiency may be achieved by dielectric coatings of the facets to adjust the reflectivities.

Figure 5:
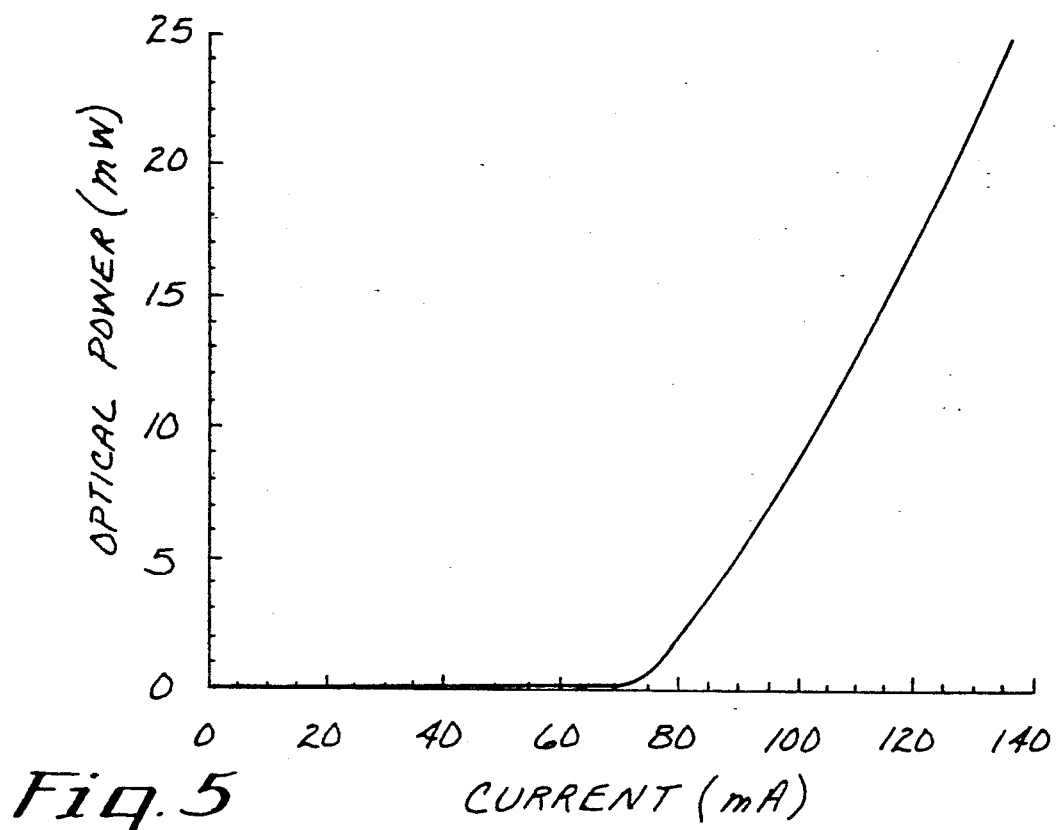
FIG. 5 is a graph of the measured optical power output from the laser diode shown in FIG. 1.

Initial tests of the prototype laser diodes 10 were conducted at 77K by pulsing the devices, typically with 500 nsec pulses and a 500 μsec period. Current measurements were made with a box-car averager, while a large Si photodetector was used to collect and monitor the output light intensity from one end facet of the device. The measured light output as a function of current (i.e., L-I) characteristics from one of the devices is illustrated in FIG. 5. The threshold current is 74 mA, which corresponds to a threshold current density of 320 A/$cm^2$. Differential quantum efficiencies in excess of 20% per facet have been measured, as have pulsed output powers of over 100 mW per facet. The coherent light is strongly TE polarized and a "speckle pattern" is clearly visible. The output laser beam has an elliptical far-field pattern, with a divergence of roughly 40°×4° for the central lobe. Side lobes are visible, indicating higher order transverse modes.

The measured L-I characteristics, such as that shown in FIG. 5, do indicate some dependence on pulse length. At high current densities, the gain in the single quantum well prototype devices tends to saturate. At the same time, the index of refraction is reduced due to the injection of excess carriers, which tends to make the region under the stripe of electrode 30 anti-guiding. Thermal effects become important at these current densities, as thermal gradients and the temperature dependence of the index provide lateral optical confinement. It is expected that these characteristics will be alleviated by index-guided versions such as laser diode 10'.

Figure 6:
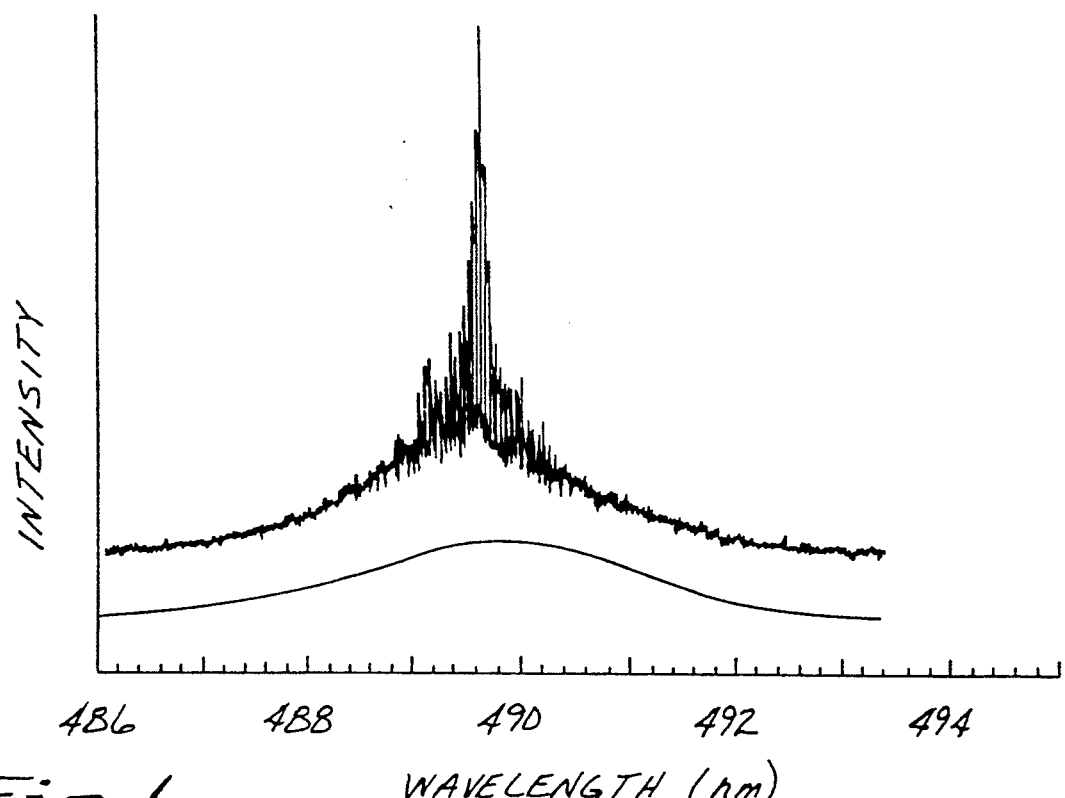
FIG. 6(a) is a graph of the measured intensity of spontaneous (non-lasing) light output from the laser diode shown in FIG. 1 as a function of wavelength.
FIG. 6(b) is a graph of the measured intensity of stimulated (lasing) light output from the laser diode shown in FIG. 1 as a function of wavelength.
FIG. 6(c) is a detailed illustration of the central wavelength portion of FIG. 6(b).

FIG. 6 is a graph of the optical spectra that are characteristic of the prototype laser diodes 10 at 77K. The spectra illustrated in FIG. 6 were acquired using a SPEX 1403 double monochromator. At currents below threshold, the spontaneous emission occurs at 490 nm and has a FWHM of about 3 nm. Above threshold, the 1060 μm long device operates in many longitudinal modes centered at 489.6 μm, and which are separated by 0.03 nm.

Laser operation has been observed in the prototype laser diodes 10 for short periods of time at temperatures as high as 200 K. At room temperature the devices emit at 502 nm, but do not lase.

The operating voltage of the prototype laser diodes 10 at the threshold current is approximately 15 V. This characteristic indicates that there is still room for improvement in the ohmic contact between electrode 30 and contact layer 26 and/or improvement in the conductivity of p-type layers 16, 22, and 26. Reducing this series resistance and improving the heat-sinking of the device (i.e., by solder-bonding the p-type side down) are expected to facilitate CW operation at higher temperatures.

It is expected that the inventive concepts disclosed herein and used to fabricate the prototype laser diode 10 are equally well suited to the fabrication of laser diodes from a wide variety of other compound II-VI semiconductor alloys, especially from other ZnSe alloys. For example, improved operating characteristics will be achieved by using lattice matched materials such as $Cd_xZn_{1-x}S$ (with x of approximately 0.61) and ZnSe to form the waveguide. The quantum well in such a device may include CdZnSe. This semiconductor system will not suffer from misfit dislocations which can decrease efficiency and the useful lifetime of the devices. Also, a multiple quantum well active layer made of a strained-layer superlattice could replace the single pseudomorphic quantum well layer 18.

Ohmic contact layer 26 might also be improved by using thin layers of smaller band gap II-VI alloys such as $ZnSe_{1-x}Te_x$, $Cd_xZn_{1-x}Se$ and $Hg_xZn_{1-x}Se$. Group VI sources other than $Se_2$ can also be used to produce ohmic contacts in accordance with the present invention. Other Group VI species $X_m$ where m<6, as well as other sources of these species, should be suitable substitutes. Other metals (e.g., Pt) or other electrically conductive materials having a large work function (e.g., >5 eV) and suitable for a stable semiconductor interface can also be used as electrodes. In conclusion, although the present invention has been described with reference to preferred embodiments, changes can be made in form and detail without departing from the spirit and scope of the invention.

What is claimed is:

1. A Group II-VI semiconductor device, including:
   a p-type Group II-VI semiconductor device layer;
   a p-type Group II-VI crystalline semiconductor contact layer on a first side of the device layer;
   a conductive electrode layer characterized by a Fermi energy, on the contact layer; and
   the contact layer is doped, with shallow acceptors having a shallow acceptor energy, to a net acceptor concentration of at least $1 \times 10^{17} cm^{-3}$, and includes sufficient deep states with energy between the shallow acceptor energy and the electrode layer Fermi energy to enable sufficient current flow for device operation with voltages less than about 2 volts across the contact layer.

2. The p-type ohmic contact of claim 1 wherein the contact layer is doped with shallow acceptors to achieve a net acceptor concentration of at least $1 \times 10^{18} cm^{-3}$.

3. The p-type ohmic contact of claim 2 wherein the contact layer is doped with nitrogen shallow acceptors.

4. The p-type ohmic contact of claim 3 wherein the contact layer is doped with nitrogen to a concentration of $1 \times 10^{19} cm^{-3}$.

5. The p-type ohmic contact of claim 1 wherein the semiconductor device layer includes a ZnSe semiconductor layer.

6. The p-type ohmic contact of claim 1 wherein the electrode layer includes a layer of material having a work function of at least 5 eV.

7. The p-type ohmic contact of claim 6 wherein the electrode layer includes a metal layer.

8. The p-type ohmic contact of claim 7 wherein the electrode layer includes a gold layer.

9. A ZnSe semiconductor device, including:
   a ZnSe pn junction including a p-type layer and an n-type layer;
   an ohmic contact to the n-type layer of the ZnSe pn junction; and
   an ohmic contact to the p-type layer of the ZnSe pn junction, including:
   a p-type ZnSe crystalline semiconductor contact layer doped with nitrogen shallow acceptors, characterized by a shallow acceptor energy, to a net acceptor concentration of at least $5 \times 10^{17} cm^{-3}$;
   a conductive electrode layer characterized by a Fermi energy; and
   sufficient deep states in the contact layer with energy between the shallow acceptor energy and the electrode layer Fermi energy to enable sufficient current flow for device operation with voltages less than about 2 volts across the contact layer.

10. The semiconductor device of claim 1 wherein the device is a II-VI electroluminescent device.

11. The semiconductor device of claim 10 wherein the device is a II-VI laser diode.

12. The semiconductor device of claim 9 wherein the device is a II-VI electroluminescent device.

13. The semiconductor device of claim 12 wherein the device is a II-VI laser diode.

14. The device of claim 1 wherein the p-type contact layer includes a ZnSe layer.

15. The device of claim 14 wherein the p-type device layer includes a ZnSe layer.

16. The device of claim 14 wherein the p-type device layer includes a ZnSSe layer.

17. The device of claim 1 wherein the p-type contact layer includes a ZnSeTe layer.

18. The device of claim 1 wherein the p-type device layer includes a ZnSSe layer.

19. A II-VI laser diode, including:

a p-type Group II-VI semiconductor device layer;

a p-type Group II-VI crystalline semiconductor contact layer on a first side of the device layer;

a conductive electrode layer characterized by a Fermi energy, on the contact layer; and the contact layer is doped, with shallow acceptors having a shallow acceptor energy, to a net acceptor concentration of at least $1 \times 10^{17} cm^{-3}$, and includes sufficient deep states with energy between the shallow acceptor energy and the electrode layer Fermi energy so the reverse bias breakdown voltage of the contact layer is less than about 2 volts.

20. The laser diode of claim 19 wherein the contact layer is doped with shallow acceptors to achieve a net acceptor concentration of at least $1 \times 10^{18} cm^{-3}$.

21. The laser diode of claim 20 wherein the contact layer is doped with nitrogen shallow acceptors.

22. The laser diode of claim 21 wherein the contact layer is doped with nitrogen to a concentration of $1 \times 10^{19} cm^{-3}$.

23. The laser diode of claim 19 wherein the semiconductor device layer includes a ZnSe semiconductor layer.

24. The laser diode of claim 19 wherein the electrode layer includes a layer of material having a work function of al least 5 eV.

25. The laser diode of claim 24 wherein the electrode layer includes a metal layer.

26. The laser diode of claim 25 wherein the electrode layer includes a gold layer.

27. The laser diode of claim 19 wherein the p-type contact layer includes a ZnSe layer.

28. The laser diode of claim 27 wherein the ZnSe p-type contact layer is doped with nitrogen to a concentration of $1 \times 10^{19} cm^{-3}$.

29. The laser diode of claim 27 wherein the p-type device layer includes a ZnSe layer.

30. The laser diode of claim 27 wherein the p-type device layer includes a ZnSSe layer.

31. The laser diode of claim 19 wherein the p-type contact layer includes a ZnSeTe layer.

32. The laser diode of claim 19 wherein the p-type device layer includes a ZnSSE layer.

* * * * *

UNITED STATES PATENT AND TRADEMARK OFFICE
CERTIFICATE OF CORRECTION

PATENT NO. : 5,274,269
DATED : December 28, 1993
INVENTOR(S) : James M. DePuydt et al.

It is certified that error appears in the above-indentified patent and that said Letters Patent is hereby corrected as shown below:

On the Cover Sheet, the title should read -- Ohmic Contact for P-Type Group II-VI Compound Semiconductors --.

Col. 1, line 11, "07/700,580" should read -- 07/700,601 --.

Col. 1, line 13, "07/700,601" should read -- 07/700,580 --.

Col. 1, line 1, the title should read -- Ohmic Contact for P-Type Group II-VI Compound semiconductors --.

Col. 7, line 13, "perioxide" should read -- peroxide --

Col. 7, line 59, "epitaxy system 10" should read -- epitaxy system 110 --.

Col. 7, line 65, "carrie din" should read -- carried in --.

Col. 9, line 31, "$IC^2$" should read -- $I/C^2$ --.

Col. 10, line 27, "As n-type" should read -- An n-type --.

Col. 11, lines 53-64, delete the text beginning on line 53 with the words "Molecular Beam" through line 64 ending with "07/573,428 is".

UNITED STATES PATENT AND TRADEMARK OFFICE
CERTIFICATE OF CORRECTION

PATENT NO. : 5,274,269

DATED : December 28, 1993

INVENTOR(S) : James M. DePuydt et al.

It is certified that error appears in the above-indentified patent and that said Letters Patent is hereby corrected as shown below:

Col. 12, line 22 "$1 \times 10^{17} cm^{-3}$ was achieved" should be -- $1 \times 10^{18} cm^{-3}$ was achieved --.

Col. 13, line 36, "$1 \times 10^{17} cm^{-3}$" should be -- $1 \times 10^{19} cm^{-3}$ --

Col. 15, line 36, "heat-sinkinq" should read -- heat-sinking --.

Signed and Sealed this

Seventeenth Day of January, 1995

Attest:

BRUCE LEHMAN

*Attesting Officer*         *Commissioner of Patents and Trademarks*